(12) United States Patent
Rüb et al.

(10) Patent No.: US 7,459,365 B2
(45) Date of Patent: Dec. 2, 2008

(54) METHOD FOR FABRICATING A SEMICONDUCTOR COMPONENT

(75) Inventors: Michael Rüb, Faak am See (AT);
Herbert Schäfer, Hoehenkirchen-Siegertsbrunn (DE);
Armin Willmeroth, Augsburg (DE);
Anton Mauder, Kolbermoor (DE);
Stefan Sedlmaier, Munich (DE);
Roland Rupp, Lauf (DE); Manfred Pippan, Noetsch (AT); Hans Weber, Ainring (DE); Frank Pfirsch, Munich (DE); Franz Hirler, Munich (DE);
Hans-Joachim Schulze, Ottobrunn (DE)

(73) Assignee: Infineon Technologies Austria AG, Villach (AT)

( * ) Notice: Subject to any disclaimer, the term of this patent is extended or adjusted under 35 U.S.C. 154(b) by 235 days.

(21) Appl. No.: 11/540,922

(22) Filed: Sep. 29, 2006

(65) Prior Publication Data

US 2007/0108513 A1 May 17, 2007

(30) Foreign Application Priority Data

Sep. 29, 2005 (DE) ............... 10 2005 046 711

(51) Int. Cl.
*H01L 21/336* (2006.01)
(52) U.S. Cl. .............. 438/268; 438/135; 438/138; 438/139; 438/243; 438/270; 257/E21.648
(58) Field of Classification Search .............. 438/135, 438/138, 139
See application file for complete search history.

(56) References Cited

U.S. PATENT DOCUMENTS 3,345,222 A    10/1967   Nomura et al.

(Continued)

FOREIGN PATENT DOCUMENTS

DE           102 14 175 A1    10/2003

(Continued)

OTHER PUBLICATIONS

Bell et al., "Porous Silicon as a Sacrificial Material," Journal of Micromechanics and Microengineering, Jun. 1996, pp. 361-369.

(Continued)

*Primary Examiner*—N. Drew Richards
*Assistant Examiner*—Kyoung Lee
(74) *Attorney, Agent, or Firm*—Maginot, Moore & Beck

(57) ABSTRACT

The fabrication of a semiconductor component having a semiconductor body in which is arranged a very thin dielectric layer having sections which run in the vertical direction and which extend very deeply into the semiconductor body is disclosed. In one method a trench is formed in a drift zone region proceeding from the front side of a semiconductor body, a sacrificial layer is produced on at least a portion of the sidewalls of the trench and at least a portion of the trench is filled with a semiconductor material which is chosen such that the quotient of the net dopant charge of the semiconductor material in the trench and the total area of the sacrificial layer on the sidewalls of the trench between the semiconductor material and the drift zone region is less than the breakdown charge of the semiconductor material, and the sacrificial layer is replaced with a dielectric.

32 Claims, 19 Drawing Sheets

U.S. PATENT DOCUMENTS 6,927,101 B2    8/2005   Henninger et al.
2003/0186507 A1*  10/2003  Henninger et al. .......... 438/270

FOREIGN PATENT DOCUMENTS

WO    WO 02/067332 A2    8/2002

OTHER PUBLICATIONS

Siffert et al., "Silicon- Evolution and Future Technology," Springer-Verlag Berlin Heidelberg 2004, pp. 159-162 and attending references.

Gösele et al., "Porous Silicon Etch-Release layer," from Science and Technology of Semiconductor Wafer Bonding (not yet published but found on the web at http://www.duke.edu/web/wbl/bondbk.html). 2 pages.

* cited by examiner

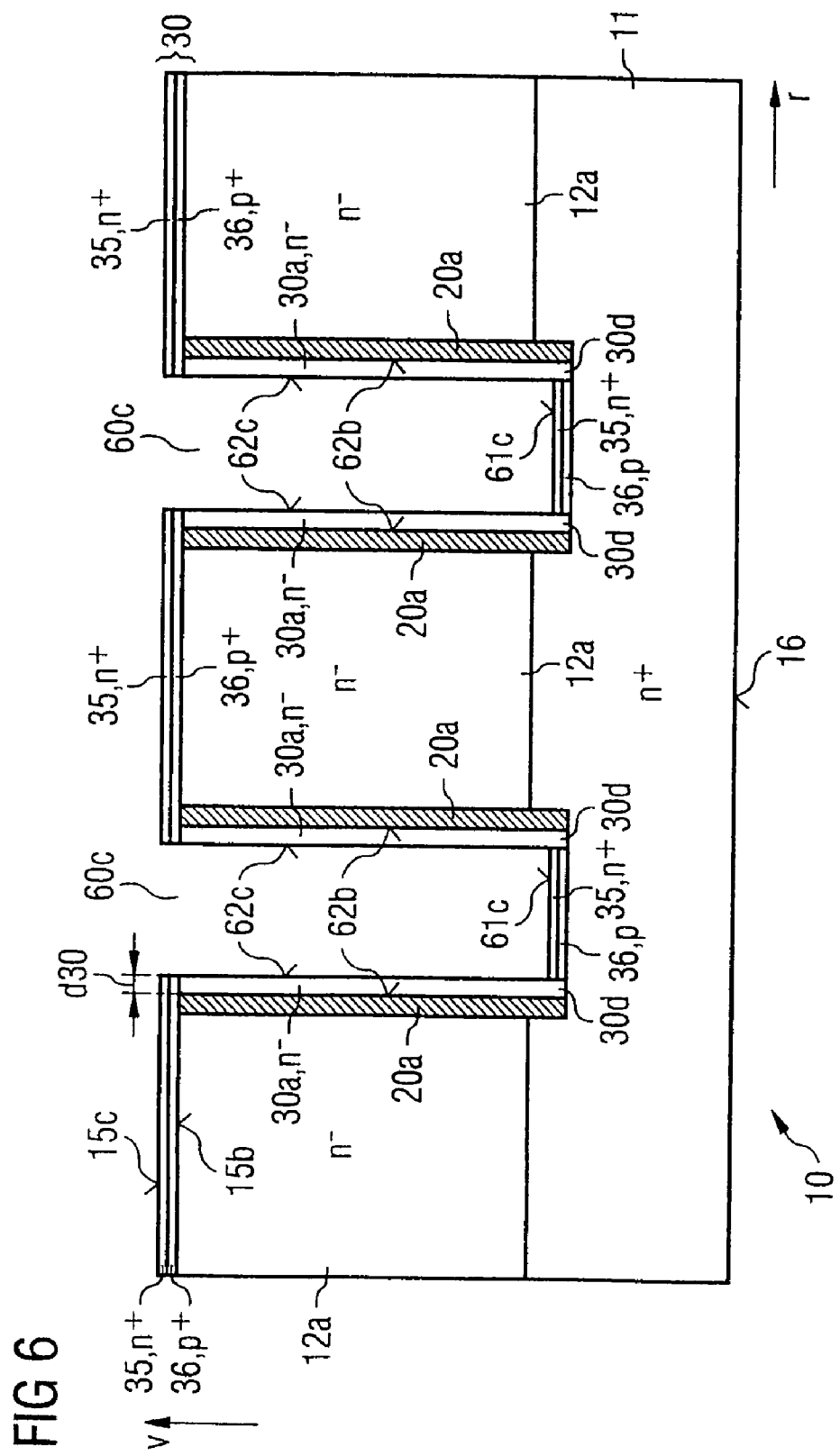

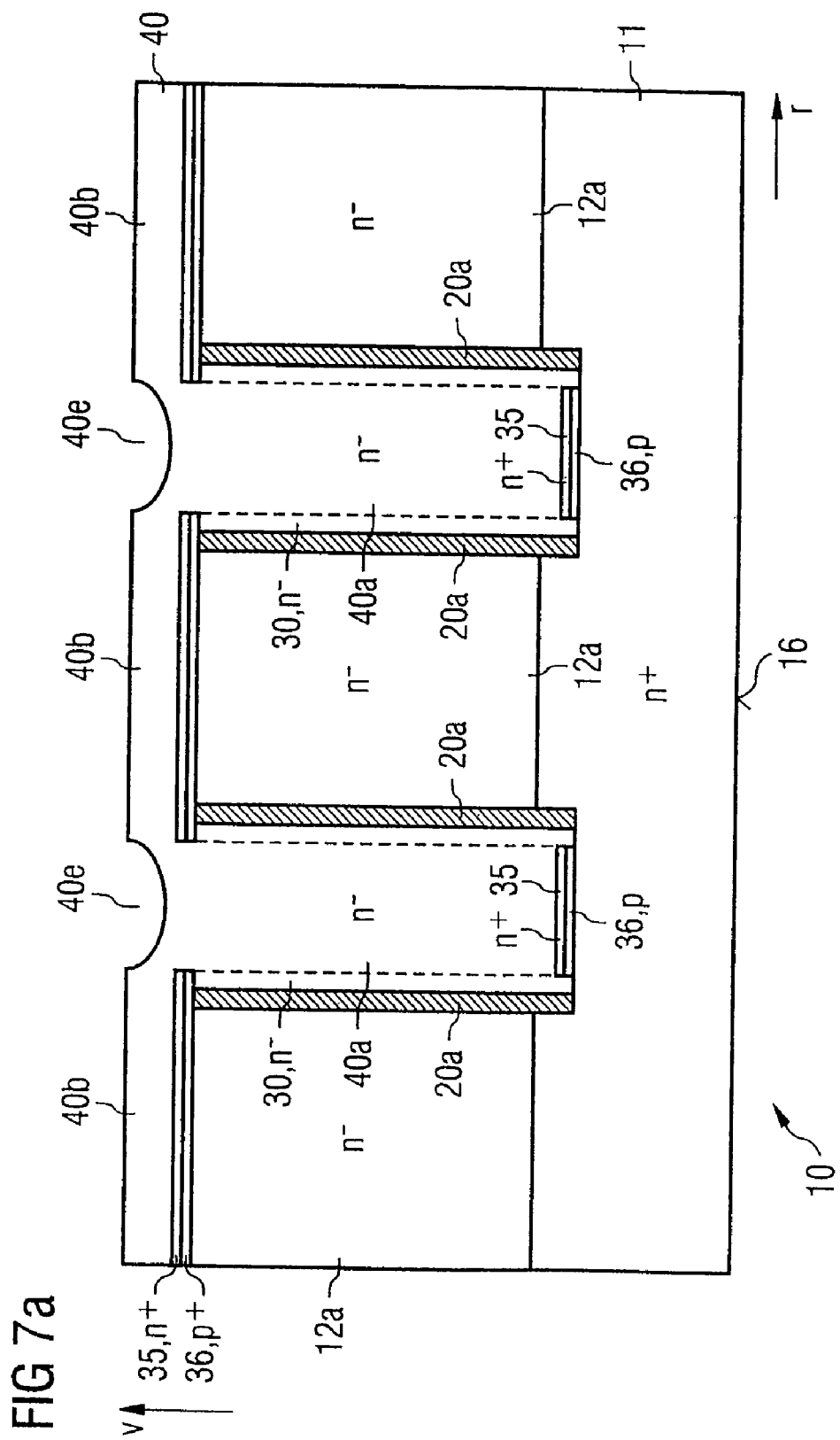

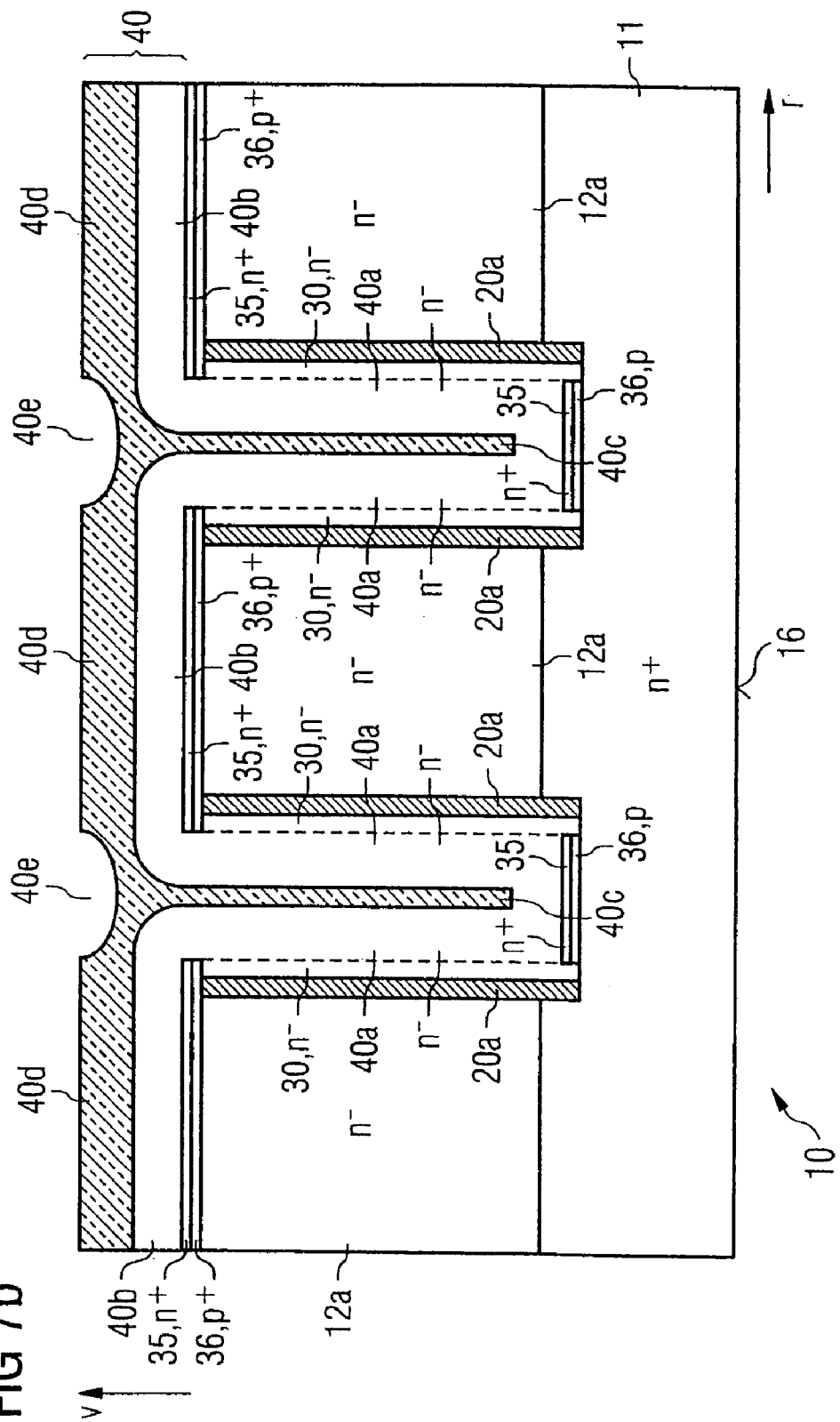

METHOD FOR FABRICATING A SEMICONDUCTOR COMPONENT

CROSS-REFERENCE TO RELATED APPLICATION

This application claims priority from German Patent Application No. 102005046711.3-33, which was filed on Sep. 29, 2005, and is incorporated herein by reference in its entirety.

FIELD OF THE INVENTION

The invention relates to a method for fabricating a vertical semiconductor component having a dielectric layer.

BACKGROUND

Very recently, a special configuration of vertical MOSFETs was developed, these MOSFETs being referred to as TEDFETs (TEDFET=Trench Extended Drain Field Effect Transistor) and being distinguished by the fact that a drift control zone is provided adjoining the drift zone, said drift control zone being dielectrically insulated from the drift zone and being coupled to the drain zone of the component. In this case, a dielectric layer is arranged between the drift zone and the drift control zone and extends very deeply into the semiconductor material of the component according to the dimensions of the drift zone.

An electric field proceeding from the drift control zone is generated during operation of the TEDFET, and brings about an accumulation of charge carriers in the drift zone in an accumulation zone adjoining the dielectric layer.

In order to obtain a good effect-of the electric field proceeding from the drift control zone on the drift zone, it is advantageous to choose the dielectric layer to be precisely thin enough to provide the required insulation strength between drift zone and drift control zone.

In the vertical direction of the semiconductor body, the dielectric layer preferably extends down to depths approximately corresponding to the dimension of the drift zone in the vertical direction. Since the dielectric strength of a vertical component depends, inter alia, on the dimensions of the drift zone in the vertical direction, it may be necessary, particularly in the case of components having a high blocking capability, to provide large vertical dimensions for the drift zone—and accompanying this for the dielectric layer for the insulation of the drift zone. Approximately 5 μm to 15 μm, preferably approximately 10 μm extent of the space charge zone in the off-state case and thus of the drift zone and drift control zone are needed per 100 V required blocking capability of the component. All the vertical dimensions mentioned in the description below are oriented toward this relationship. By way of example, the required vertical dimension of the dielectric layer in the case of a TEDFET having a dielectric strength of 600 V may accordingly be between approximately 30 μm and 90 μm, preferably more than 50 μm.

In order to realize such components it is therefore necessary to produce dielectric layers between two semiconductor zones which, on the one hand, have to extend deeply into the semiconductor body in the vertical direction and on the other hand, are intended to have a small thickness. In this case, the ratio between the dimension of said dielectric layer in the vertical direction of the semiconductor body and its thickness, which is also referred to as the aspect ratio, may be more than 1000:1.

Such high aspect ratios in conjunction with a small thickness of the dielectric layer could not be realized heretofore.

SUMMARY

In one exemplary method according to the invention for fabricating a dielectric layer which is arranged in the semiconductor body of a semiconductor component and which has sections extending in the vertical direction of the semiconductor body, firstly a trench is produced in the semiconductor body provided, in a manner proceeding from a front side of the semiconductor body, the width of said trench being large in comparison with the thickness of the dielectric layer to be fabricated.

A coating is then produced, which is applied at least in sections at least to the sidewalls of the trench. In this case, the coating is formed as a dielectric and/or serves as a sacrificial layer. The remaining trench is subsequently at least partly filled with a filling layer made of a semiconductor material.

The coating may be produced by the material forming the dielectric being applied externally at least to the sidewall of the trench, for example, by means of a deposition method. However, the coating may likewise be produced by oxidation of the semiconductor material of the semiconductor body, for example silicon. The dielectric layer preferably comprises silicon dioxide ($SiO_2$) or silicon carbide (SiC) or is completely formed from one of said materials.

Compared with silicon dioxide., silicon carbide has a dielectric constant that is higher by a factor of approximately 2.5, which means, for the same electrical voltage between drift zone and drift control zone, an improved accumulation of charge carriers in the accumulation zone and accompanying this improved on-state properties of the component.

A further embodiment of the invention provides for the coating to be used wholly or partly as-a sacrificial layer which, after the trench has been at least partly filled, is removed and replaced by the material of the dielectric layer to be fabricated. For the sacrificial layer, a material is preferably used which has a high etching selectivity with respect to the materials that are to be electrically insulated from one another, that is to say that under the influence of a predetermined etchant, the etching rate of the sacrificial layer is significantly greater than the etching rate of the materials that are to be electrically insulated from one another.

If, by way of example, the materials that are to be electrically insulated from one another are crystalline silicon in each case, then suitable materials for the sacrificial layer are, in particular, silicon-germanium (SiGe) with a germanium proportion of preferably at least 20 at %, particularly preferably at least 25 at %.

A sacrificial layer may likewise also be formed from porous silicon since the latter has an etching selectivity with respect to crystalline silicon of 10 000:1 to 100 000:1.

In specific components it is advantageous if the semiconductor material applied to the sacrificial layer is formed in a monocrystalline fashion. In the case of a monocrystalline semiconductor body this can be achieved the most simply by the dielectric and/or sacrificial layer that is applied at least to the trench walls being formed in monocrystalline fashion since the semiconductor material that is to be applied thereto can then grow further in monocrystalline fashion.

This holds true at least when the dielectric and/or sacrificial layer has, on its side facing the trench, a lattice constant which, at a temperature of 300 K, differs only slightly, preferably by at most 0.6%, from the lattice constant of a single crystal formed from the semiconductor material to be applied.

After the fabrication of the coating—irrespective of whether the latter at least partly forms the dielectric layer to be fabricated or else constitutes a sacrificial layer—the trench is at least partly filled with a semiconductor material adjoining the sacrificial layer. Said semiconductor material is chosen in such a way that the quotient of the net dopant charge of the semiconductor material arranged in the spatial region of the removed drift zone region and the total area of the sections of the sacrificial layer which are arranged between the semiconductor material and the drift zone region is less than the breakdown charge of the semiconductor material.

BRIEF DESCRIPTION OF THE DRAWINGS

Embodiments of the invention are explained in more detail below with reference to figures.

FIG. 6 shows the arrangement in accordance with FIG. 5 after the fabrication of a diode structure in the growth layer in the bottom region of the trenches.

FIG. 7a shows the arrangement in accordance with FIG. 6 after the trenches have been completely filled with a semiconductor material.

FIG. 7b shows the arrangement in accordance with FIG. 6 after the trenches have firstly been partly filled with semiconductor material and have then been completely filled with a dielectric.

DETAILED DESCRIPTION

In the figures, unless specified otherwise, identical reference symbols designate identical component regions with the same meaning.

An explanation is given below of how a thin dielectric layer having vertical sections can be fabricated with a high aspect ratio between two semiconductor zones, which in the case of a TEDFET correspond to the drift zone and drift control zone thereof. All of the figures show in the lateral direction in each case only one section of the component to be fabricated. Owing to the high aspect ratios, the illustrations are not true to scale.

Figure 1:
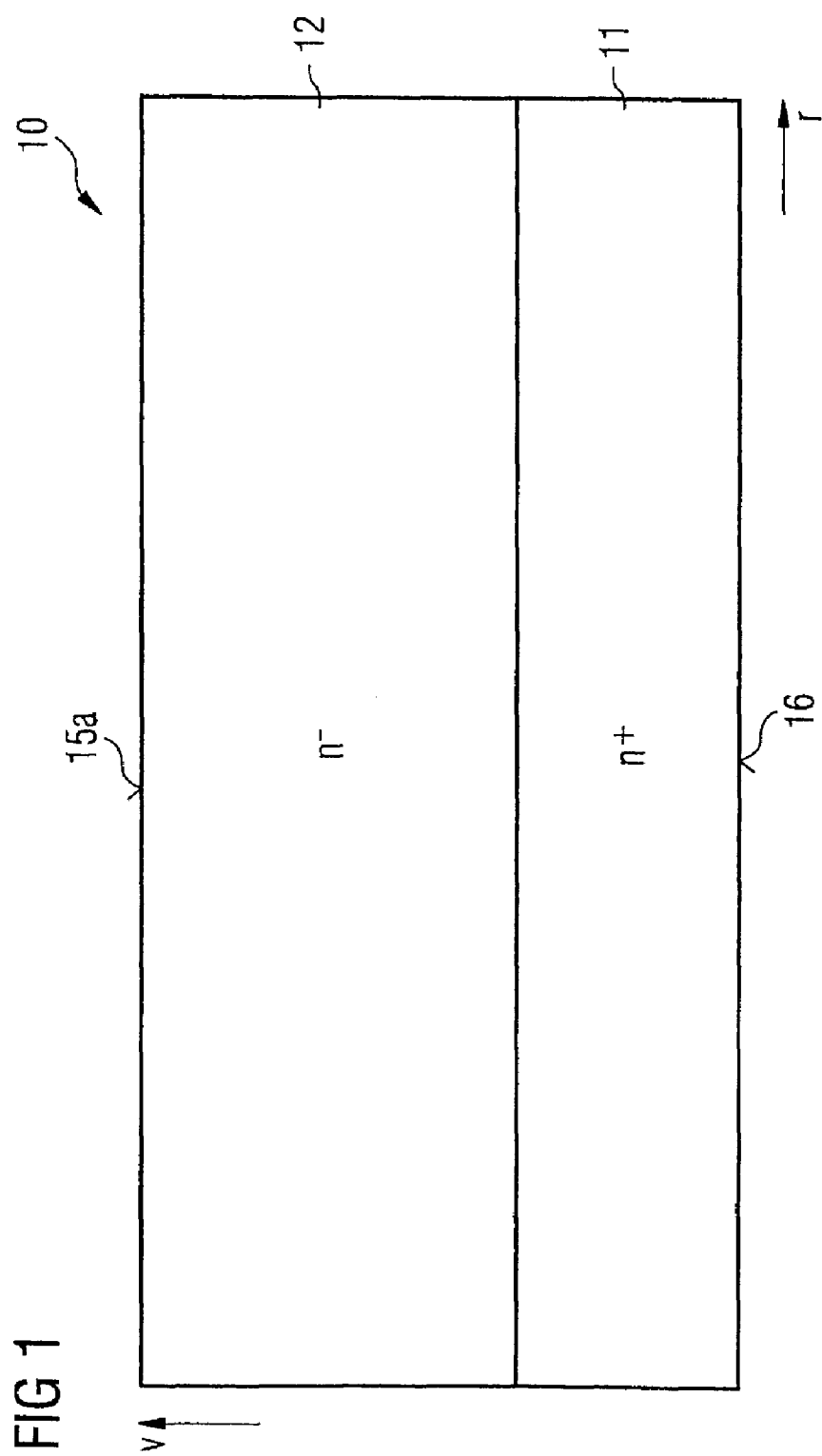
FIG. 1 shows an excerpt from a semiconductor body with a heavily n-doped substrate and arranged thereon, a weakly n-doped semiconductor layer produced epitaxially, in cross section.

FIG. 1 shows a semiconductor body 10, which is composed of silicon, for example. Said semiconductor body 10 has a front side 15a, perpendicular to a vertical direction v, and, in the example, comprises a highly doped semiconductor layer 11 and a more weakly doped semiconductor layer 12 applied to the highly doped semiconductor layer 11. The more weakly doped semiconductor layer 12 forms a first side 15a of the semiconductor body 10, which is referred to hereinafter as the front side, while the highly doped first semiconductor layer 11 forms a second side 16, which is referred to hereinafter as the rear side. The highly doped semiconductor layer 11 is a semiconductor substrate, for example, to which the more weakly doped semiconductor layer 12 is applied by means of an epitaxy method.

It is assumed for the further explanation that the two semiconductor layers 11, 12 are n-doped. It goes without saying, however, that there is also the possibility of realizing these two semiconductor layers as p-doped layers.

In order to realize the semiconductor body having two semiconductor layers 11, 12 as illustrated in FIG. 1 it is also possible, in a weakly n-doped semiconductor body 10, for n-doping dopants to be indiffused into the semiconductor body 10 proceeding from the rear side 16 thereof, with the result that the heavily n-doped layer 11 arises.

As shown as the result in FIG. 2, trenches 60a having a width b and a depth t are subsequently produced in the semiconductor body 10, said trenches extending into the semiconductor body 10 proceeding from the front side 15a. In order to fabricate said trenches 60a, a patterned hard mask layer 90 is applied to the front side 15a of the semiconductor body 10. Using said mask layer 90, the trenches 60a having a width b and a depth t are etched into the semiconductor body 10 by means of an anisotropic etching method, the walls 62a of said trenches ideally running perpendicular to the front side of the semiconductor body 10.

The width of the trenches 60a is, for example, 0.4 μm to 5 μm and their depth for a component under consideration here with a blocking capability of 600 V is for example at least 30 μm, preferably at least 50 μm. For components having a higher or lower blocking capability, the depth is to be adapted correspondingly. The minimum trench width depends on the corresponding trench depth since the maximum aspect ratio, that is to say the ratio of the depth to the width of the trench, is limited in etching processes for fabricating trenches. Typical values for the aspect ratio lie between 10:1 and 50:1, but aspect ratios of more than 100:1 are already being achieved in correspondingly highly developed etching processes.

Generally, the depth of a trench 60a per 100 V blocking capability of the TEDFET to be fabricated is preferably 5 µm to 15 µm. Given an aspect ratio within the range of 10:1 to 100:1, this results in a trench width of 0.05 µm to 1.5 µm per 100 V blocking capability.

The trenches 60a have bottoms 61a and sidewalls 62a and preferably extend at least as far as the heavily n-doped substrate 11. In principle, however, the bottoms 61a of the trenches 60a may also be spaced apart from the heavily n-doped semiconductor layer 11. The sidewalls 62a preferably run perpendicular to the front side 15a of the semiconductor body 10.

Sections 12a of the more weakly doped semiconductor layer 12 remain between the trenches 60a. Said sections 12a are spaced apart from one another in a lateral direction r perpendicular to the vertical direction v and form the drift zone of the component.

The dimensions of the drift zones and thus the depth t of the trenches 60a depend, in particular, on the required reverse voltage strength of the component to be fabricated, since it is necessary to reduce the reverse voltage within the drift zone.

For a semiconductor component having a reverse voltage strength of 600 V, the trench depth t may be, for example, 50 µm to 60 µm given a trench width b of approximately 2 µm.

Optionally, after the fabrication of the trenches 60a, the semiconductor body 10 may be subjected to aftertreatment wet-chemically or using a sacrificial oxide at least in the region of the vertical sidewalls 62a of the trenches 60a, in order to remove any polymer residues or other residues. Moreover, at least the sidewalls 62a may be subjected to a heat treatment in a hydrogen atmosphere in order to smooth them.

Figure 3:
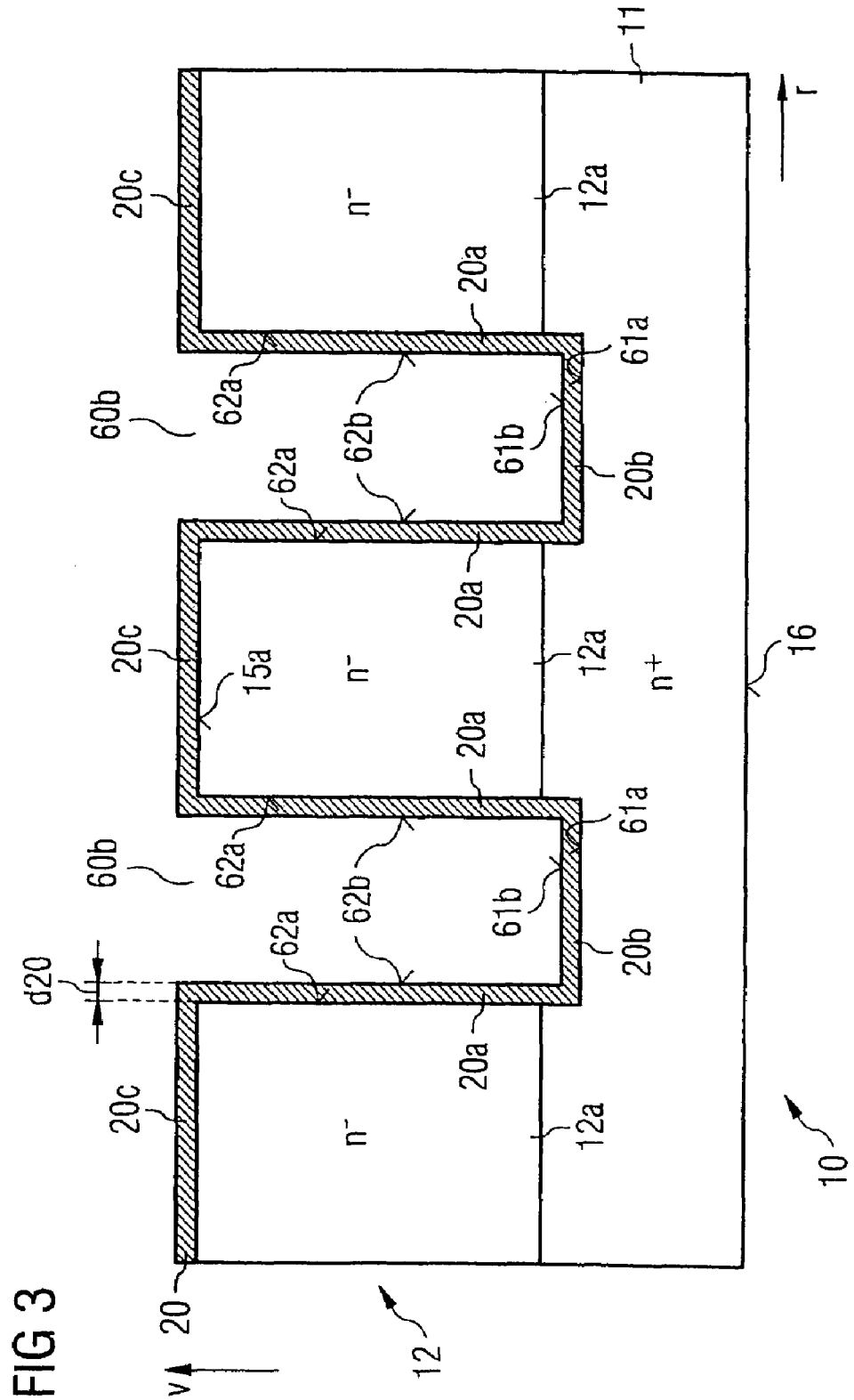
FIG. 3 shows the arrangement in accordance with FIG. 2 to which a sacrificial layer and/or a coating serving as a dielectric layer has been applied after the removal of the patterned mask layer.

As shown as the result in FIG. 3, after the removal of the patterned mask layer 90, a monocrystalline coating 20, for example made up of silicon-germanium (SiGe), having a layer thickness d20 of e.g. 10 nm to 30 nm is applied to the semiconductor body 10. The coating 20 is preferably fabricated epitaxially and has sections 20a arranged on the trench walls 62a, sections 20b arranged on the trench bottoms 61a, and also sections 20c arranged on the front side 15a of the semiconductor body 10. This coating 20 forms a sacrificial layer, as will be explained.

During subsequent method steps, a monocrystalline semiconductor layer adjacent to the coating 20 is produced, which semiconductor layer is preferably formed from the same semiconductor material as the epitaxial layer 12. In order to achieve a dislocation-free pseudomorphic growth of this monocrystalline coating to be fabricated on the silicon-germanium coating 20, a maximum thickness dependent on the Ge proportion of the layer must not be exceeded. At the same time, it must be taken into consideration here that the lattice constant of silicon-germanium increases as the germanium proportion rises, and in association with this differs to a greater and greater extent from the lattice constant of crystalline silicon.

Typical maximum layer thicknesses of the SiGe layers given a Ge proportion of up to 25% are in the region of less than 10 nm. In this case, the Ge proportion of the layer also cannot be increased (or else reduced again) abruptly but rather with a gradient over a few nm from a concentration—e.g. 0—to the maximum value.

Since the silicon-germanium coating 20 is a sacrificial layer which is intended to be removed by a later etching process without damaging the adjoining semiconductor material of the sections 12a and the monocrystalline coating to be fabricated thereon, it is advantageous if the silicon-germanium coating 20 is doped, for example with boron, since a doping further increases the etching selectivity of the silicon-germanium coating with respect to silicon.

As shown as the result in FIG. 4, the sections 20b of the coating 20 which are arranged on the bottoms 61b of the trenches 60b and also the sections 20c of the coating 20 which are arranged on the front side 15a of the semiconductor body 10 are subsequently removed by means of an anisotropic etch, while the vertical sections 20a remain on the sidewalls.

In order to ensure that the sections 20b, 20c of the coating are completely removed, the etch is effected in such a way that preferably a thin layer of the front side 15a of the semiconductor body 10 is concomitantly removed. The front side of the semiconductor body 10, somewhat thinned in this region, is designated by 15b hereinafter.

After these method steps, the semiconductor body 10 has residual trenches 60b' which are subsequently wholly or partly filled with semiconductor material in monocrystalline fashion. The filling is preferably effected by means of selective epitaxy using the process gases dichlorosilane ($SiH_2Cl_2$) and also using hydrogen ($H_2$) and hydrochloric acid (HCl) for dilution and as etching-back components.

Figure 4:
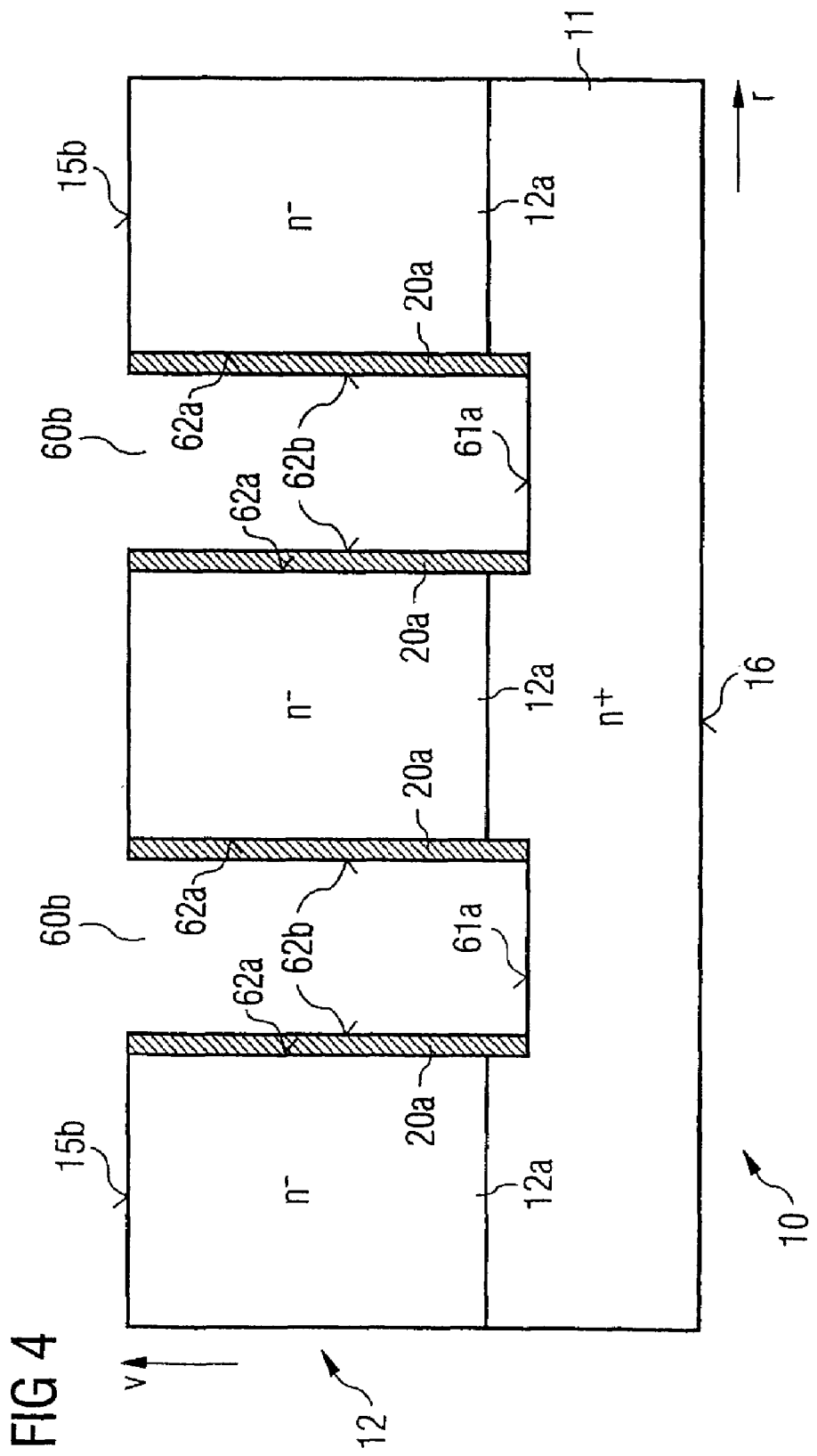
FIG. 4 shows the arrangement in accordance with FIG. 3 after the removal of the coating from the bottom of the trenches.
Figure 5:
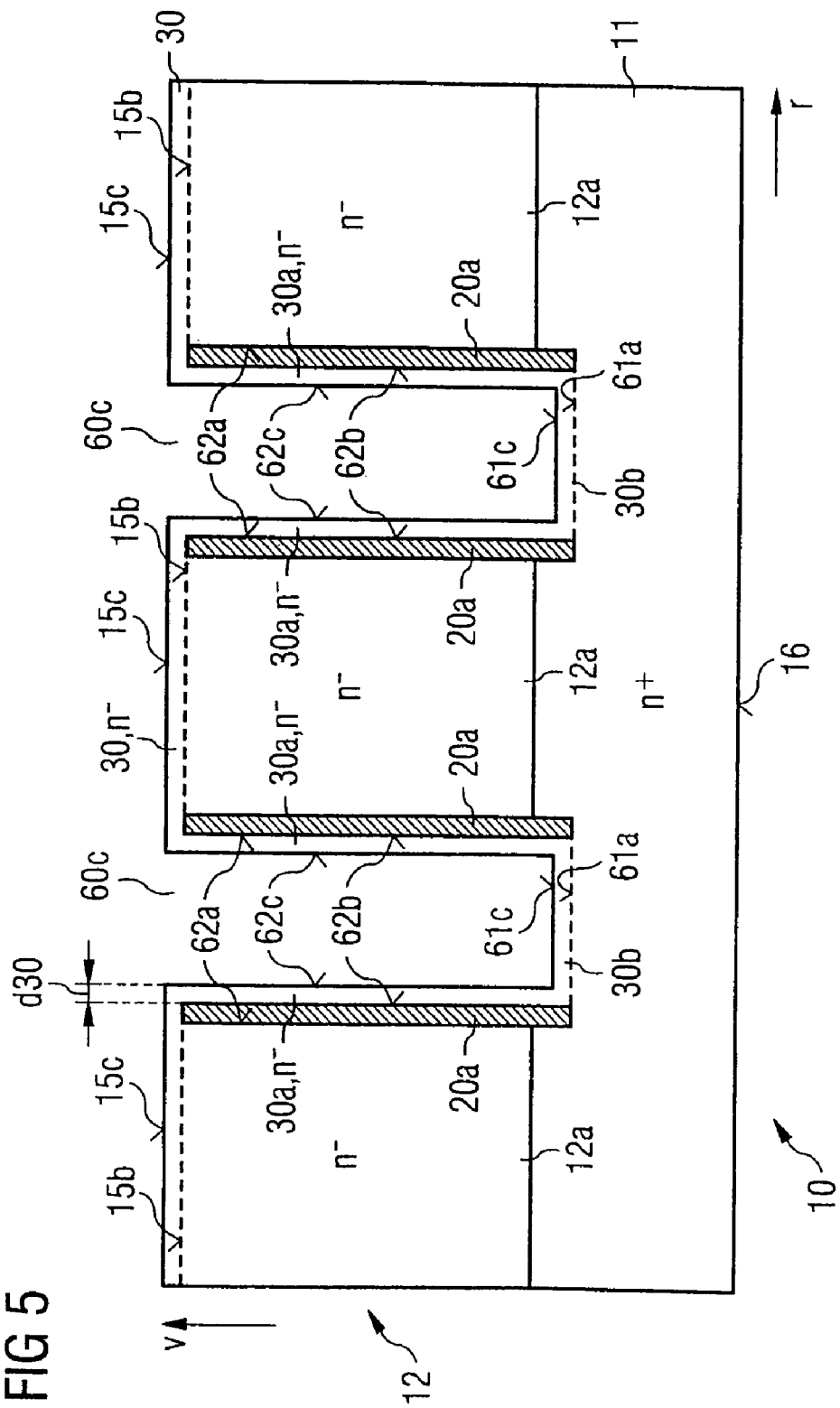
FIG. 5 shows the arrangement in accordance with FIG. 4 after the application of a monocrystalline growth layer.

FIG. 5 shows the arrangement in accordance with FIG. 4 after the growth of a thin, monocrystalline and weakly n-doped silicon layer 30 having a thickness d30 of preferably a few tens of nm to a few hundreds of nm. The monocrystalline silicon layer 30 accepts the information about its crystal orientation both from the bottoms 61c of the residual trenches 60c which are formed by the substrate 11, and from the sections 20a which have remained from the monocrystalline silicon-germanium coating and are arranged on the sidewalls 62c of the residual trenches 60c.

The monocrystalline silicon layer 30 is referred to as growth layer 30 hereinafter. A preferably rapidly growing monocrystalline epitaxial layer is intended to be grown on said growth layer at a later point in time.

The fabrication of the growth layer 30 may be effected for example according to the method of epitaxial overgrowth of insulator layers with monocrystalline silicon, the insulator layers to be overgrown being provided by the sections 20a of the coating 20 in accordance with FIG. 4. This method is explained in more detail for horizontally overgrown insulator layers in U.S. Pat. No. 3,345,222.

The fact that crystal defects can occur at the edge of the insulator layers during this fabrication method does not have a disturbing effect on the function of the component since the growth layer 30 can be etched back, in a manner yet to be explained, to an extent such that the crystal defects near the front side of the component are concomitantly removed.

Crystal defects of the growth layer 30 which occur in the region of the growth layer 30 in which the latter is arranged adjacent to the highly doped substrate 11 are approximately of no importance for the function of the component.

Optionally, at least the sidewalls 62b of the residual trench 60b may be subjected to a heat treatment in a hydrogen atmosphere in order to smooth them.

Prior to the trenches 60c being filled with a semiconductor material, a diode structure is preferably produced in the section 30b of the growth layer 30 at the bottom of the trenches 60c, said diode structure serving to couple the semiconductor zone to be fabricated in the trenches 60c to the highly doped semiconductor substrate 11. In a TEDFET, the highly doped semiconductor zone 11 forms the drain zone thereof, while the semiconductor material deposited in the trenches 60c forms the drift control zone thereof.

FIG. 6 shows the arrangement in accordance with FIG. 5 after the fabrication of a diode structure 35, 36 comprising a heavily n-doped diode zone 35 and also a p-doped diode zone 36 arranged between the heavily n-doped diode zone 35 and the heavily n-doped substrate 11. The pn junction of the diode 35, 36 is formed between the heavily n-doped diode zone 35 and the p-doped diode zone 36.

The heavily n-doped diode zone 35 and the p-doped diode zone 36 are fabricated for example in each case by means of an implantation of dopants at an angle of incidence of 0°, that is to say perpendicular to the front side 15c of the semiconductor body 10.

The sections 30a of the growth layer 30 which are in this case arranged in the region of the sidewalls 62b of the trench 60b in accordance with FIG. 4 in this case protect the sections 20a of the silicon-germanium coating and also the adjoining regions of the sections 12a of the epitaxial layer 12 against possible penetration of dopants in the event of glancing incidence during the implantation.

As an alternative to the method explained-previously, the anisotropic etching-technological removal of the horizontally running sections 20b, 20c of the coating 20 in accordance with FIG. 3 and the fabrication of the growth layer 30 in accordance with FIG. 5 may also be interchanged in their order. In this case, the growth layer would remain after the anisotropic etch on the vertically running section 20a of the coating 20 and additionally protect the latter from the anisotropic etch during the removal of the horizontal sections 20a, 20c of the coating 20 in accordance with FIG. 3.

A glancing implantation of dopants into the vertically running sections of the growth layer 30 which is thereby effected in the context of fabricating the heavily n-doped diode zone 35 and the p-doped diode zone 36 may subsequently be removed again by isotropic etching back, the growth layer in this case preferably only being thinned but not completely removed. The fact that the penetration depth of dopant atoms incident in glancing fashion into the vertical regions of the growth layer is significantly smaller than the penetration depth of the desired doping zones at the bottom of the trenches 60c has an advantageous effect in this case.

As illustrated in FIG. 6, sections 30d of the growth layer 30 remain between the diode zones 35, 36 and the residual sections 20a of the coating, and would lead to a shunt circuit of the diode 35, 36.

In order to avoid such a shunt circuit, in a diffusion step the dopants implanted into the diode zones 35, 36 are outdiffused in the lateral direction r into the growth layer 30a as far as the residual sections 20a of the coating, so that the diode 35, 36 as a result is directly adjacent to said sections 20a. In this case, the thickness d30 of the growth layer 30 is adapted to the diffusion behavior of the dopants forming the diode zones 35, 36 and also to the concentrations of said dopants. The diffusion step for the diffusion of the dopants contained in the diode zones 35, 36 may be effected at an arbitrary later point in time, if appropriate together with the outdiffusion of dopants in other regions of the component.

In the diffusion step explained previously, the intention is to avoid the situation where the dopants of the lower, p-doped diode zone 36 diffuse too far into the underlying sections of the heavily n-doped substrate 11, since the on resistance of the component would otherwise be impaired. In this case, the sections 20a of the silicon-germanium coating also serve as a diffusion barrier.

If boron is used as a dopant for the fabrication of the p-doped diode zone 36, then the diffusion of germanium from the section 20a of the silicon-germanium coating is very small in comparison with the diffusion of boron from the p-doped diode zone 36, since the diffusion constant of germanium in silicon is smaller by approximately two orders of magnitude in comparison with the diffusion constant of boron in silicon.

After the fabrication of the diode 35, 36, the trenches 60c are wholly or partly filled with a monocrystalline semiconductor material.

As is shown as the result in FIG. 7a, for this purpose semiconductor material, for example weakly n-doped monocrystalline silicon, may be grown on over the whole area until the residual trenches 60c are completely filled.

The filling layer 40 has depressions 40e above the filled residual trenches 60c, the depth of which depressions decreases with the width of the residual trenches 60c illustrated in FIG. 6. The semiconductor sections of the filling layer 40 which are arranged in said residual trenches 60c are designated by the reference symbol 40a, and semiconductor sections of the filling layer 40 which are applied to the front side are designated by the reference symbol 40b.

The boundary between the growth layer 30 and the additionally applied semiconductor layer 40 is illustrated by dashed lines in FIG. 7a. The semiconductor material of the section 40a is preferably identical with the material of the growth layer 30, as a result of which the crystal structure of the growth layer 30 ideally continues in the material of the section 40.

As is shown as the result in FIG. 7b, as an alternative to a complete filling of the trenches 60c with semiconductor material, there is the possibility of semiconductor material 40a, for example, weakly n-doped monocrystalline silicon, being grown on over the whole area in the residual trenches 60c in accordance with FIG. 6, but said trenches 60c only being partly filled with the semiconductor material 40a. A complete filling may subsequently be performed with a dielectric 40c, for example silicon dioxide. The advantage of such a residual filling 40c with a dielectric consists in the fact that the dielectric strength of the component is ensured even when shrink holes remain in the material after the filling. After the conclusion of these method steps, sections 40b of the monocrystalline semiconductor layer and 40d of the dielectric are applied above the front side of the semiconductor body.

Figure 8:
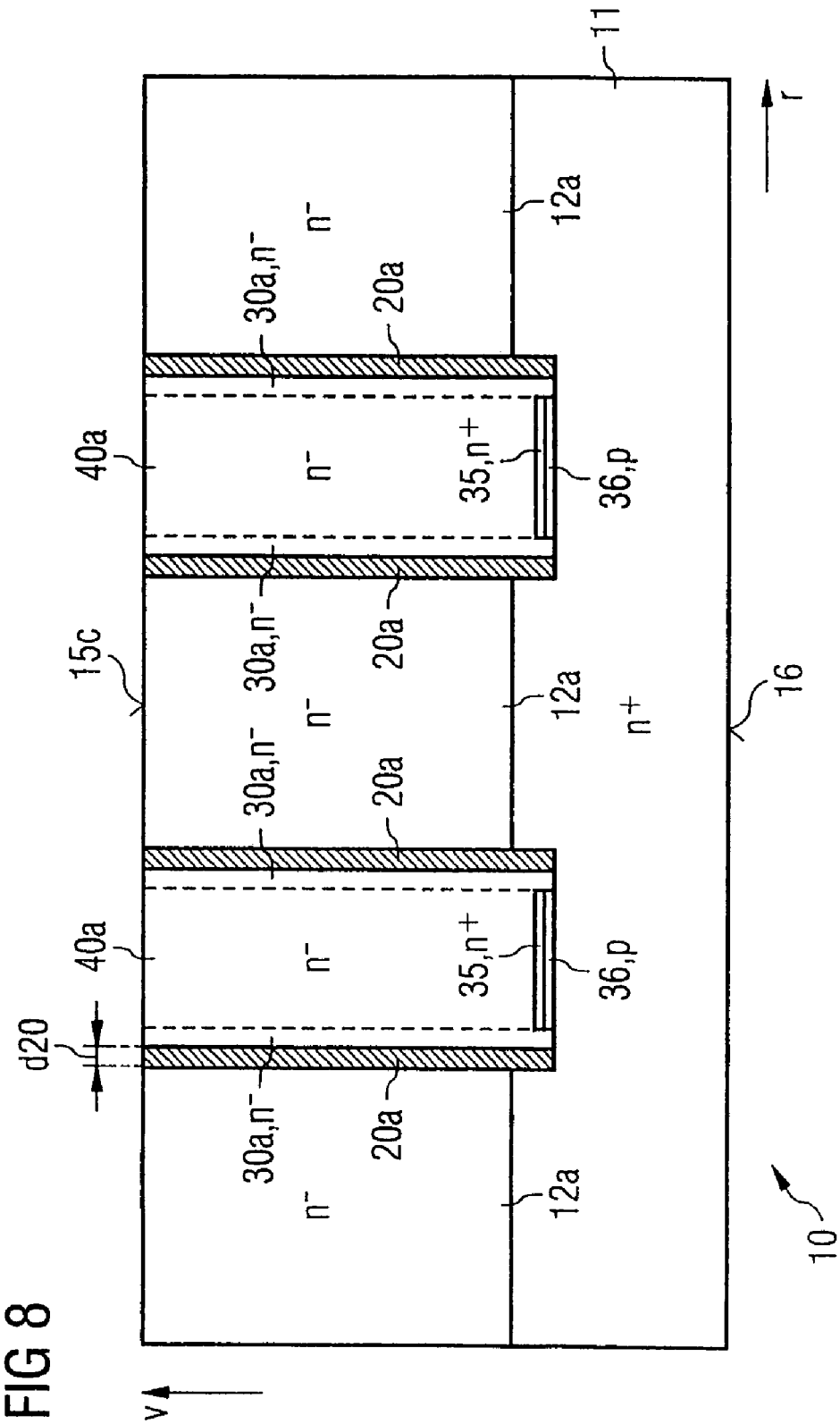
FIG. 8 shows the arrangement in accordance with FIG. 7a after planarization of the front side and etching back.

As is shown as the result in FIG. 8 proceeding from the component structure in accordance with FIG. 7a, the component structure produced after filling the trenches with semiconductor material is planarized in the region of the front side. The section 40b of the monocrystalline semiconductor layer and also the highly doped semiconductor layers 35, 36 of the front side of the component structure are removed as a result of this planarization. Since the semiconductor sections arranged above the sections 20a of the silicon-germanium coating are not required for the TEDFET to be fabricated, the arrangement in accordance with FIGS. 7a or 7b is planarized on the front side so that the sections 20a of the silicon-germanium coating extend as far as the front side 15c of the etched-back and planarized semiconductor body 10.

The planarization of the component structure prior to the etching back may be effected, for example, by spinning on photoresist having low viscosity above the front side in order, on the one hand, to achieve a good filling of the depression 40e that remained in the filling layer in accordance with the FIGS. 7a and 7b and in order, on the other hand, to have to apply only a thinnest possible layer.

Another possibility for the planarization of the semiconductor body 10 is the spin-on glass method according to a method in which a glass layer I is applied to the uneven surface of the component structure illustrated in FIGS. 7a and 7b.

Spin-on glass is usually silicate glass particles which can be spun on—hence the name—as a finely distributed suspension in a solvent such as a resist and thereby fill depressions. After the evaporation of the solvent, an unconsolidated glass layer forms which can be densified by a heat treatment process.

The etching back is effected by means of an etching method, in particular, for example, by means of a dry-chemical etching-back method, in which case the etching selectivity of silicon with respect to the planarization material used, for example the spun-on photoresist, should be as near as possible to one in order to achieve a uniform material removal on the front side and thereby to obtain an as planar surface as possible of the semiconductor body uncovered after the etching back. With the use of photoresist as planarization material, an etching selectivity of one can be set for example by way of the proportion of oxygen in the etching gas.

The etching back is preferably effected in two stages, in which case in a first etching-back step, the material applied for planarization is etched back with detection of an end point of the etching method until the silicon semiconductor material of the filling layer 40 is uncovered.

A control layer comprising an oxide and/or comprising a nitride and/or comprising silicon-germanium (SiGe) and/or comprising silicon carbide (SiC) and/or comprising silicon-germanium carbide (SiGeC) may optionally be provided for the end point detection. Such a control layer is preferably applied to the front side 15a of the arrangement in accordance with FIG. 1 and patterned together with the epitaxial layer 12 using the patterned mask layer 90 in accordance with FIG. 2.

In a second etching-back step, a fixed time etching back is effected, at least until the sections 20a of the silicon-germanium coating reach as far as the front-side surface of the semiconductor body 10 and the optional control layer has been completely removed.

In an alternative single-stage etching-back method, for example a chemical mechanical polishing (CMP) method, the semiconductor body is etched back until uncovering of the sections 20a of the silicon-germanium layer is detected by removal of germanium from the silicon-germanium layer.

A chemical mechanical polishing method is suitable without a previously applied planarization layer in conjunction with residual filling of the trenches with a dielectric only when the dielectric has a sufficiently high CMP selectivity with respect to the material of the filling layer 40 since the height of the dielectric has to be adapted to the height of the sections 20a of the silicon-germanium coating. Dishing of the dielectric and/or of the silicon-germanium coating or the filling layer 40 may otherwise occur.

Once the sections 20a of the silicon-germanium coating reach as far as the surface 15c of the etched-back semiconductor body 10, the vertical sections 20a of the coating serving as a sacrificial layer are removed and replaced by the final material for the fabrication of the dielectric layer. For this purpose, the sections 20a of the silicon-germanium coating are etched for example by means of a wet-chemical etching operation with very good selectivity with respect to silicon and are removed in the process. The etching selectivity may assume values of far in excess of 100 depending on the germanium content of the section 20a.

When choosing the germanium proportion of the silicon-germanium coating, it must be taken into consideration that the lattice constant thereof differs from the lattice constant of crystalline silicon to an ever greater extent as the germanium proportion increases. With an excessively large germanium proportion, the growth layer 30 can no longer form in monocrystalline fashion. The germanium proportion of the silicon-germanium coating should therefore be no greater than 25 at %; the germanium proportion preferably lies between 10 at % and 18 at %.

For the case where the etching selectivity of the silicon-germanium sections 20a with respect to the monocrystalline silicon of the growth layer and the semiconductor zone 12a is insufficient, instead of silicon-germanium it is also possible to use for example boron-doped silicon-germanium in the fabrication of the coating 20 in accordance with FIG. 3 since the etching selectivity can be improved given a suitable boron doping depending on the process conditions. In this case, boron concentrations preferably lie below $10^{19}$ boron atoms/cm$^3$.

During the selective etching-technological removal of the vertical sections 20a of the silicon-germanium coating, silicon is also removed somewhat from the sections 12a of the epitaxial layer 12, the growth layer 30 and also from the substrate 11. A trench formed by etching out the sections 20a of the silicon-germanium coating tapers in the direction of the rear side 16. This tapering makes it possible to grow silicon dioxide in the wall region of the very narrow trenches by thermal oxidation of the adjoining silicon and to completely fill the very narrow trenches.

Figure 9:
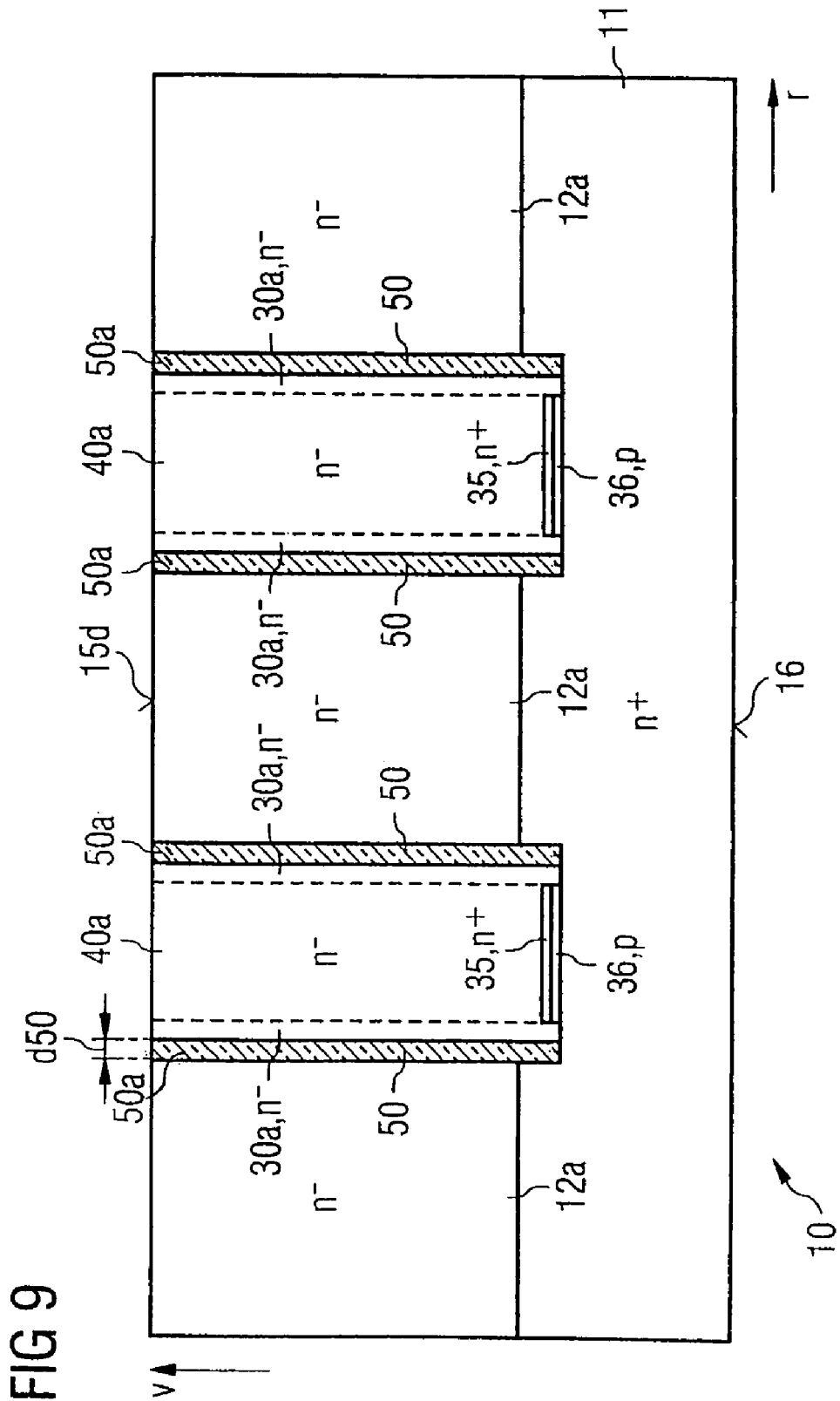
FIG. 9 shows the arrangement in accordance with FIG. 8 after the coating has been removed by selective etching and replaced by a dielectric layer.

FIG. 9 shows the component structure of the sacrificial silicon-germanium layer 20a by a dielectric layer 50 formed as a silicon oxide layer. On account of the previously explained tapering of the narrow trenches after the removal of the sacrificial layer 20a, said dielectric layer 50 likewise tapers somewhat in the direction of the rear side 16 in a manner that is not specifically illustrated.

The thermal oxidation on the one hand causes the very narrow trenches to be grown together, and on the other hand causes the formation of silicon dioxide in that region of the walls of the very narrow trenches which is near the surface. As a result, the thickness d50 of the silicon dioxide dielectric layer 50 amounts to approximately 1.78 times the thickness d20 (see FIGS. 3 and 8) of the original coating 20. In a departure from the actual conditions, the thicknesses d20 and d50 are illustrated as identical in the figures.

The preferred thickness d20 of the coating 20 in accordance with FIG. 3 is 10 nm to 35 nm, while the thickness d50 of the finished dielectric layer 50 is between 30 nm and 105 nm.

In order to achieve a predetermined thickness d50 during the fabrication of a dielectric layer by thermal oxidation of silicon from the material of the sidewalls of the very narrow trenches, the thickness d20 of the coating 20 in accordance with FIG. 3 must be less than the thickness d50. The thickness d20 is preferably dimensioned depending on the thickness d50 according to the following relationship:

$$d20 = 0.56 \times d50$$

i.e. the thickness d20 preferably amounts to between 50% and 60% of the thickness d50 of the dielectric layer to be fabricated by thermal oxidation.

The filling of the very narrow trenches need not necessarily be effected by means of thermal oxidation. As an alternative or in addition, the very narrow trenches may also be filled or closed off by a chemical vapor deposition (CVD) with tetraethoxysilane (TEOS) or borophosphorus glass (BPSG).

Optionally, the dielectric layer 50 produced, which possibly contains outdiffused boron in the case of a boron-doped silicon-germanium coating, may once again be removed by wet-chemical etching and the walls of the trench thereby formed may subsequently once again be oxidized to form silicon dioxide by means of a preferably thermal oxidation.

The process sequence "wet-chemical etching for removal of the silicon dioxide with subsequent oxidation of the walls of the trench thereby formed" can be repeated a number of times until the desired oxide thickness is achieved.

In the case of a boron-doped silicon-germanium coating, with each wet-chemical etching step for removing the oxide, boron is also oxidized and removed together with the oxide. It goes without saying that instead of boron it is also possible to use any other dopant which increases the etching selectivity of the silicon-germanium coating with respect to silicon.

As a result of the possibly multiple wet-chemical removal of the silicon dioxide, crystal defects or other imperfections near the original interface between the silicon-germanium coating and the adjoining semiconductor regions are also oxidized and removed.

A very thin layer at the front side 15c of the semiconductor body 10 in accordance with FIG. 8 is additionally removed as a result of the possibly multiple etching steps—owing to the high etching selectivity although only to a very small extent. The front side of the semiconductor body 10 according to this method is designated by 10d.

The thickness of the dielectric layer 50 is to be adapted to the voltage difference which is present in the finished component between the semiconductor zone 12a and the semiconductor zone 30a, 40a, which corresponds to the drift control zone in the case of a TEDFET.

In the case of a TEDFET, said voltage difference is greatest at the front-side end 50a of the dielectric layer 50 and decreases somewhat with increasing distance from the front side 15d. As a result of the above-described rear-side tapering of the dielectric layer 50, the thickness thereof additionally decreases with increasing distance from the front side 15d, so that the profile of said voltage difference and the profile of the dielectric layer thickness required for insulation are approximately adapted to one another, which means an optimization of the on resistance as a result.

Figure 2:
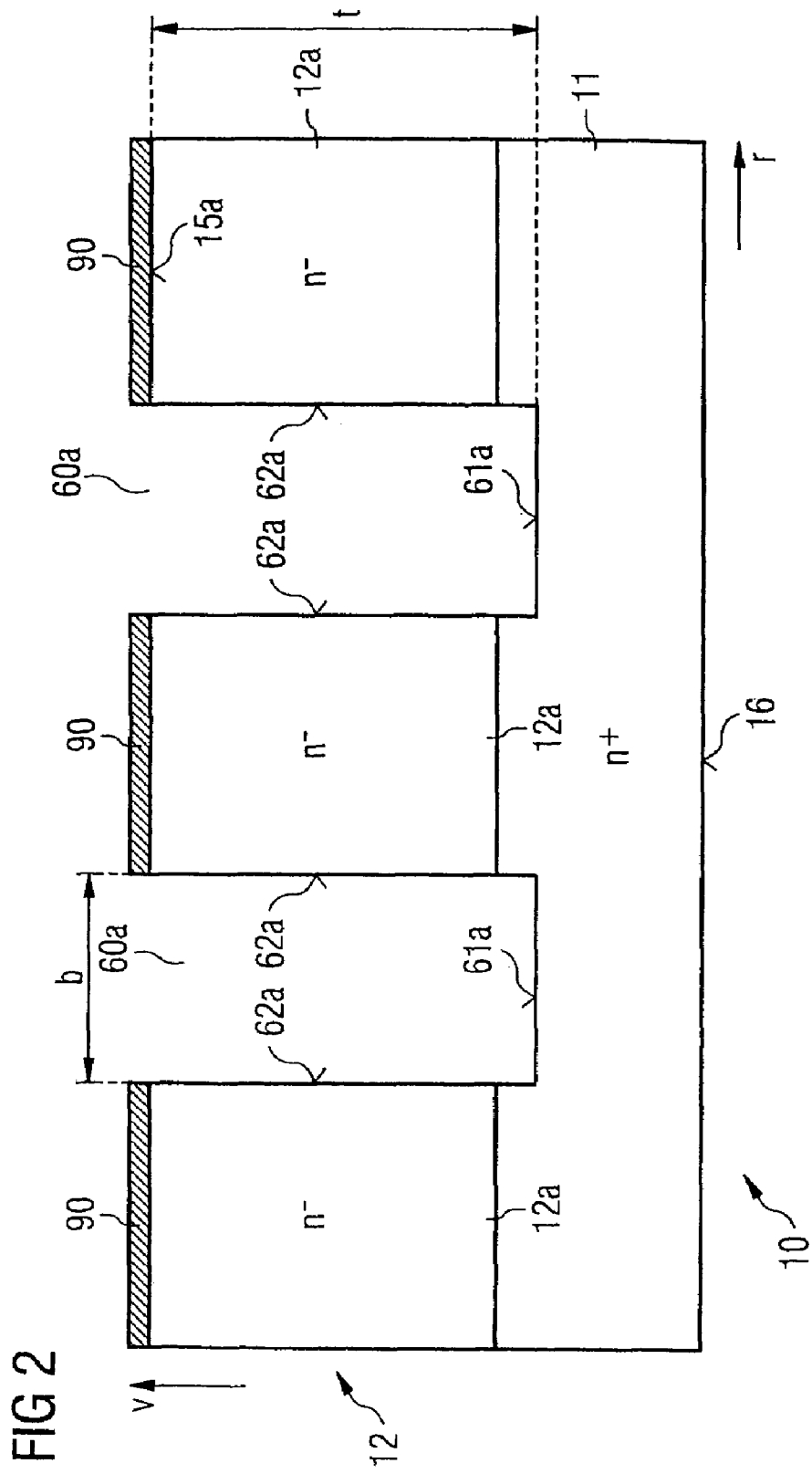
FIG. 2 shows the semiconductor body in accordance with FIG. 1 into which a plurality of trenches have been etched by means of an anisotropic etching method using a patterned mask layer.
Figure 10:
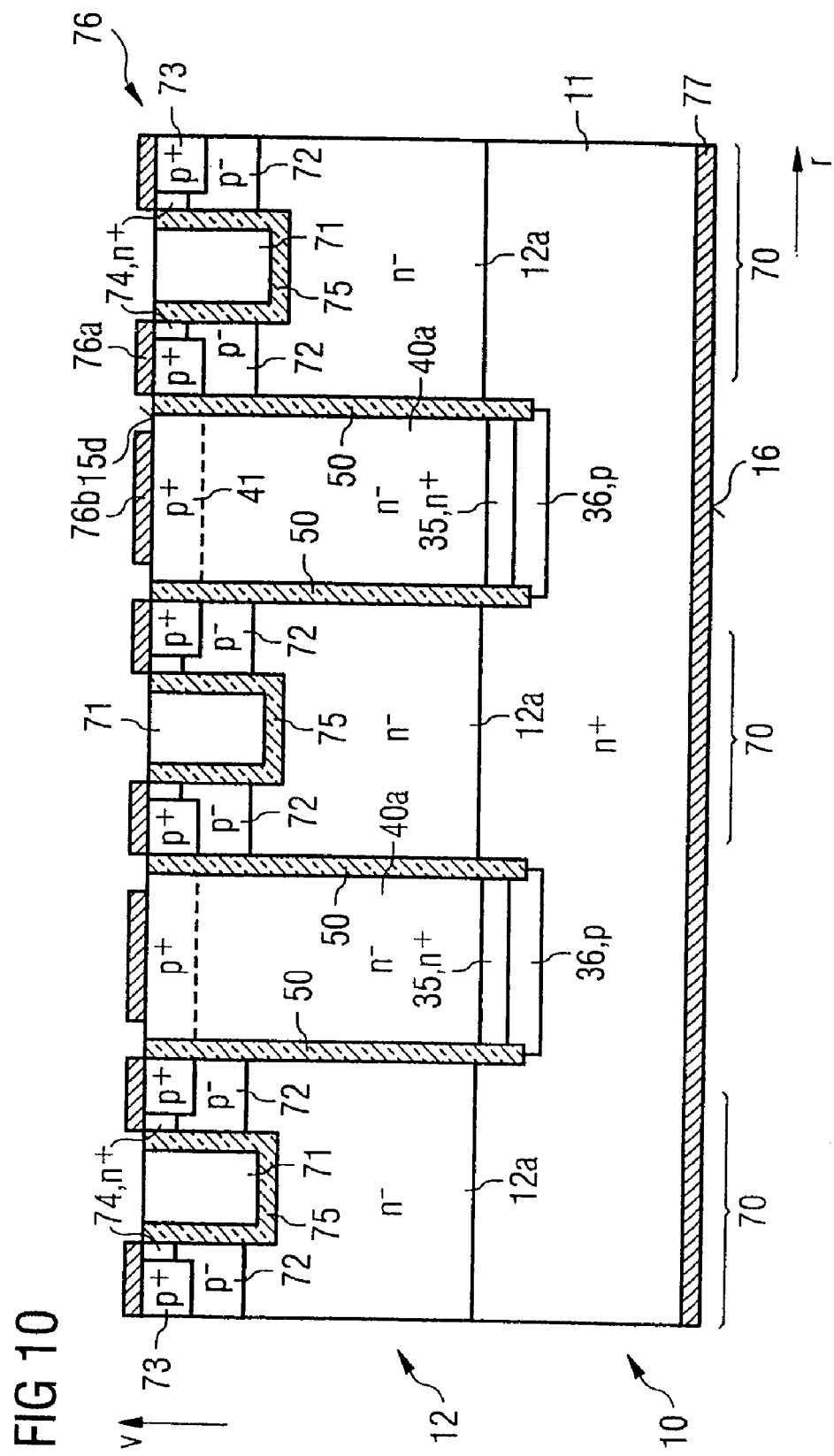
FIG. 10 shows a cross section through a section of a completed TEDFET based on an arrangement in accordance with FIG. 9.

As is shown as the result in FIG. 10, in order to realize a TEDFET, MOS transistor cells are fabricated in the sections 12a of the epitaxial layer 12 which remained after the fabrication of the trenches as illustrated in FIG. 2. The transistor cells are in each case fabricated in the region of the front side of the component structure, so that sections of the epitaxial layer 12 still remain which have the basic doping of the epitaxial layer and which form the later drift zone of the component. The transistor cells each comprise a p-doped body zone 72 and also an n-doped source zone 74, the body zone 72 being arranged between the source zone 74 and the section 12a having the basic doping of the epitaxial layer. Each of the transistor cells has a gate electrode 71, which extends into the component structure in the vertical direction proceeding from the front side 15d and which reaches in the vertical direction right into that section 12a of the epitaxial layer 12 which has the basic doping. The gate electrode 71 is insulated from the semiconductor zones by means of a gate dielectric 75. The body zone 72 and the source zone 74 may be fabricated by means of conventional implantation and diffusion methods. The gate electrode 71 is fabricated by means of a sufficiently known etching of a trench which is filled with the gate dielectric 75 and the gate electrode 71.

The transistor cells preferably each have bypass zones 73 which are adjacent to the dielectric layer 50 and which connect the body zone 72 to a metallization 76a—applied to the front side 15d—for the source electrode.

There is optionally the possibility of producing a complementarily doped semiconductor layer 41 above the monocrystalline semiconductor layer 40a filling the trenches, said complementarily doped semiconductor layer being contact-connected by means of a connection electrode 76b.

In the context of the heat treatment steps required for the fabrication of the body zones 72, the bypass zones 73 and also the source zones 74, an outdiffusion of the dopants introduced into the heavily doped diode zones 35, 36 also occurs, so that the diode zones 35, 36 reach as far as the dielectric layer 50 in the lateral direction r after the heat treatment steps.

The remaining sections 12a of the epitaxial layer form the drift zones of the MOSFET transistor cells 70, and the remaining sections 40a' of the filling layer which are arranged between adjacent MOSFET transistor cells 70 form the drift control zones of the TEDFET. Furthermore, the heavily n-doped substrate 11 forms the common drain zone of the MOSFET transistor cells 70.

In the present exemplary embodiment, the diode zones 35, 36 are completely arranged in the zone of the original substrate 11. Furthermore, the dielectric layer 50 extends in the vertical direction right into the zone of the substrate 11.

Given suitably chosen etching depths t in accordance with FIG. 2 and also a suitable thickness d20 of the coating 20 in the region of the bottoms 61a in accordance with FIG. 3, the diodes 35, 36 may also be arranged wholly or partly above the substrate 11, an electrically conductive connection between the substrate 11 and the diode zone 36 doped complementarily with respect to the substrate 11 being required.

What can likewise be achieved through a suitable choice of the etching depth t in accordance with FIG. 2 and the thickness d20 of the coating 20 in the region of the bottoms 61a in accordance with FIG. 3 is that the dielectric layer 50 reaches as far as the heavily n-doped layer 11 in flush fashion, extends into said heavily n-doped layer or else is spaced apart from said heavily n-doped layer.

The coating 20 illustrated in FIG. 3 need not be formed as a sacrificial layer, but rather may remain wholly or partly in the semiconductor body 10 in order to form or to concomitantly form the dielectric layer 50 to be fabricated or to be converted at least partly into the dielectric layer by means of a chemical reaction.

In both the former cases, the above-described steps of removing the vertical sections of the coating 20 by means of selective etching and subsequently refilling the trenches produced by the selective etching may be obviated.

It is nevertheless possible, however, to increase the thickness of the dielectric layer to be fabricated progressively by possibly multiple repetition of the steps "removing the dielectric layer by selective etching" followed by "oxidation of the sidewalls of the trench produced by the selective etching".

In the special case where silicon dioxide is used for the coating 20 in FIG. 3 this need not necessarily be produced by deposition. In this case, it is likewise possible to produce the coating 20 by oxidation of the semiconductor material.

An alternative method for filling the trenches 60b illustrated in FIG. 4 is explained below on the basis of a further exemplary embodiment. A prerequisite for this is that the coating 20 illustrated in FIG. 3 and thus the vertical sections 20a illustrated in FIG. 4 are formed from an oxide, for example from silicon dioxide. A semiconductor layer may be applied to such an oxide layer by means of a selective epitaxy method, said semiconductor layer corresponding to the semiconductor layer which is illustrated in FIG. 5 and designated by the reference symbol 30.

In the case of a filling layer produced by a selective epitaxy method, however, crystal defects may occur at the epitaxial layer produced, in particular at the interfaces between the vertical sections 20a of the sacrificial or dielectric layer and the growth layer 30 in accordance with FIG. 5. In order to anneal said crystal defects, the vertical sections 20a may be removed by selective etching after the fabrication of the epitaxial filling and after the etching back of the filling layer (see FIG. 8), so that the above-mentioned interfaces of the monocrystalline filling, in particular of the growth layer 30, are accessible and the crystal defects present there can be annealed.

In order to anneal the crystal defects, the interfaces may be treated, for example, by methods such as oxidation or annealing of the crystal defects by heat treatment of the semiconductor body in a hydrogen atmosphere.

The above-explained method for fabricating a thin vertical dielectric layer using a sacrificial layer on the basis of an example of a sacrificial layer made of silicon-germanium is not restricted to silicon-germanium sacrificial layers. In principle, all materials are suitable which enable—presupposing a suitable etchant—a selective etching with respect to the materials into which the sacrificial layer is embedded and which are not intended to be removed by the etching.

In order that said materials are adversely affected as little as possible by the etching operation for removing the sacrificial layer, it is advantageous if the sacrificial layer has a highest possible etching selectivity with respect to said materials.

In many electrical components, such as the TEDFET presented by way of example, the materials which, if possible, are intended not to be influenced by the etching operation comprise crystalline semiconductor material, in particular crystalline silicon.

The etching selectivity of porous silicon with respect to crystalline silicon is approximately 4 to 5 orders of magnitude (10 000:1 to 100 000:1). Therefore, porous silicon is preferably suitable as a material for fabricating a sacrificial layer in a silicon semiconductor body, in particular for fabricating a coating 20 formed as a sacrificial layer in accordance with FIG. 3.

The fabrication of porous silicon, in turn, may be effected by conversion of n-doped or preferably of p-doped silicon by chemical or anodic electrochemical etching, the etching acting only on the doped silicon and only the latter being converted into porous silicon. In this case, the conversion rate is greatly dependent on the dopant concentration, where a distinction is to be made between p-doped and n-doped silicon.

In the case of p-doped silicon as starting material for the conversion, the dopant concentration for the p-doped silicon is preferably chosen to be greater than $10^{16}$ cm$^{-3}$.

In the case of n-doped silicon as starting material for the conversion into porous silicon, the net dopant concentration is preferably at least $10^{16}$ cm$^{-3}$, particularly preferably at least $10^{18}$ cm$^{-3}$.

The fabrication of a coating 20 in accordance with FIG. 3 which is provided in sections for the later conversion of doped, preferably p-doped, silicon into porous silicon is effected for example by means of epitaxial growth and/or by means of outdiffusion of the p-type dopant from the vapor phase and/or by means of atomic layer deposition (ALD) and/or by means of outdiffusion from doped glass, which is subsequently removed again.

Porous silicon may likewise be produced by masked anodic etching in hydrofluoric acid, as is explained in more detail in EP 0 296 348 B1 and in T. E. Bell et al.: "Porous silicon as a sacrificial material", Journal of Micromechanics and Microengineering, issue June 1996, pages 361-369.

A further suitable method for fabricating porous silicon having an etching selectivity of up to 100 000:1 is mentioned in P. Siffert et al.: "Silicon—Evolution and Future of a Technology", Springer Verlag Berlin, Heidelberg, 2004.

Porous silicon may additionally be fabricated according to chapter 7.3.1.5 "Porous silicon etch-release layer" of the Internet page of the Laboratory for Semiconductor Wafer Bonding at Duke University, Durham, N.C. 27708, USA, U. Gösele, Q.-Y. Tong et al., http://www.duke.edu/web/wbl/ch7/ch7-hpge.html#7.3.1.5, dated Aug. 23, 2005.

The conversion of doped silicon into porous silicon is preferably effected when the doped silicon to be converted is accessible over a large area, it being possible, in principle, for the conversion also to be effected after the front-side etching back if—as illustrated in FIG. 8—the sections 20a on the front side reach as far as the surface of the semiconductor body 10.

In the previously explained exemplary embodiment for fabricating a TEDFET, at least the vertical sections 20a of the coating 20 in accordance with FIGS. 3 and 4 have to be converted into porous silicon, that is to say that the conversion has to be effected after the fabrication of the doped coating 20 in accordance with FIG. 3, it being unimportant whether the conversion takes place prior to or after the removal of the horizontal sections 20b, 20c in accordance with FIG. 2.

The inadvertent conversion of other highly doped regions, for example, of the heavily n-doped substrate 11 in accordance with FIG. 3, into porous silicon can be prevented by protecting the relevant regions by means of a polycrystalline semiconductor layer and/or a deposited oxide layer.

As an alternative to this, there is also the possibility of accepting the, in part, undesired conversion of heavily doped silicon into porous silicon and subsequently removing the converted parts for example by means of an etching or polishing method.

In the previously explained method for fabricating a narrow dielectric layer, instead of silicon-germanium, for the coating 20 it is also possible to use doped, preferably p-doped, silicon which is selectively converted into porous silicon in a subsequent step by means of chemical or anodic electrochemical etching. This conversion may be applied to the remaining sections 20a of the coating 20 (FIG. 4) after the fabrication of the coating 20 (FIG. 3) or after the anisotropic etching back of the coating 20. The advantage of the procedure last mentioned is that the doped silicon to be converted, that is to say in particular the sections 20a, are accessible over a large area.

In the last-mentioned case, however, depending on the dopant concentration of the substrate 11, a more or less pronounced conversion of the heavily n-doped silicon of the substrate 11 into porous silicon also occurs in that region of the substrate which adjoins the bottom 61a of the depression 60b. This porous silicon produced at the bottom of the depression can be removed by means of an anisotropic etching step.

A conversion of the doped silicon of the sections 20a of the coating 20 may likewise be effected after the fabrication of a growth layer 30 (FIG. 5), after the fabrication of a diode 35, 36 and/or after the filling of the trenches 60c (FIGS. 6, 7a and 7b) and after the planarization and etching back (FIG. 8).

Particularly after the etching back illustrated as the result in FIG. 8, the sections 20a of the original doped coating 20 are accessible via the surface of the semiconductor arrangement produced and can be converted into porous silicon.

The arrangement shown in FIG. 8 arises as a result, in which arrangement the sections 20a of the original coating 20 comprise porous silicon. This porous silicon of the sections 20a can be etched selectively with respect to the silicon of the adjoining sections 12*a,* 30 and 11. The trenches thereby produced can subsequently be filled by means of a dielectric.

The fabrication of the dielectric in the very narrow trenches produced by the selective etching of the sections 20*a* may be effected by means of one of the methods as have already been explained previously and which are required to arrive at the arrangement in accordance with FIG. 9 from the arrangement in accordance with FIG. 8.

A crucial aspect for the choice of porous silicon as a sacrificial layer, besides its high etching selectivity with respect to crystalline silicon, resides in the fact that the porous silicon can be overgrown epitaxially. This is of importance particularly for the fabrication of the growth layer 30 in accordance with FIG. 5 since the latter is intended to be formed in monocrystalline fashion for a high-quality TEDFET component.

An additional layer, e.g. $Si_xGe_yC_z$ made of silicon, germanium and carbon, where one of the values y or z is also permitted to be zero, may optionally be produced in, below or on the coating 20 in accordance with FIG. 3 made of doped silicon prior to the anisotropic etching back. Such an additional layer makes it possible to stop the front-side etching back of the semiconductor body 10, in particular the etching back of the latter's regions arranged on the front side of the sections 20*a* in accordance with FIGS. 7*a* and 7*b*, by end point detection when the top side of said additional layer begins to be uncovered at the surface.

Depending on whether the additional layer is arranged in, below or on the coating 20 in accordance with FIG. 3, the horizontally running sections 20*b,* 20*c* of the coating 20 illustrated in FIG. 3 are partly removed, completely removed or not removed at all during the front-side etching back.

It is likewise possible for such an additional layer also to be applied on the front side to the as yet unpatterned epitaxial layer 12 in accordance with FIG. 1 as early as prior to the production of the patterned mask layer 90 and prior to the production of the trenches 60*a* in accordance with FIG. 2. Said additional layer for end point control may be patterned together with the epitaxial layer 12 by means of the subsequent masked etching of the trenches 60*a* in accordance with FIG. 2 and, after the patterning, remains only on those sections 12*a* of the epitaxial layer 12 which are produced by the patterning. The additional layer may be formed for example from $Si_xGe_yC_z$, where y, z are also permitted individually to be equal to zero, or from an oxide or a nitride. Said additional layer is removed after the planarization by means of a fixed time etch and/or by means of a selective etch. In this respect, reference is made to the explanations in connection with FIGS. 7*a,* 7*b,* and 8.

The anisotropic etch of the coating 20 in accordance with FIG. 3 together with the additional layer may also be effected in masked fashion, so that the sections 20*c* of the coating 20 and also those sections of the additional layer that are situated between the sections 20*c* and the sections 12*a* wholly or partly remain at the top side of the sections 12*a* of the epitaxial layer 12 (FIG. 3), while those sections 20*b* of the coating 20 which are situated in the region of the trench bottoms 61*a* and also those sections of the additional layer which are situated in the region of the trench bottoms 61*a* are completely removed.

During the later etching back, said sections of the additional layer which have remained in the region of the front side on the sections 12*a* may be used for end point detection for the etching back. These residual sections of the additional layer may be removed in a subsequent separate etching step.

All the previous exemplary embodiments relate to the fact that the originally fabricated coating 20 in accordance with FIG. 3 constitutes a sacrificial layer at least in sections. However, a thin dielectric layer may also be fabricated without prior production of a sacrificial layer. In this case, the original coating 20 (FIG. 3) is already fabricated from the material which is intended to be used for the finished dielectric layer.

For fabricating a coating 20 (FIG. 3) which is simultaneously intended to form the dielectric layer to be fabricated, such materials are preferably suitable which have, in free crystalline form, a lattice constant which differs only slightly, preferably by less than 0.6% at a temperature of 300 K, from the lattice constant of the semiconductor body, preferably silicon. In this case, the lattice constant of the coating 20—presupposing a sufficiently thin coating 20—is adapted to the greatest possible extent to the lattice constant of the semiconductor body.

As a result of this, a monocrystalline growth layer 30 whose lattice constant is adapted to the lattice constant of the sections 12*a* and to the lattice constant of the substrate 11 and thus to the lattice constant of the semiconductor body 10 may once again be grown on the coating 20 or the sections 20*a* thereof. Preferred materials for fabricating such a coating 20 are for example silicon carbide (SiC), $Al_2O_3$, sapphire or ruby.

If the coating 20 (FIG. 3) is already formed from the material of the dielectric layer to be fabricated, the sections 20*a* of the coating no longer have to be selectively etched out from the semiconductor body 10 and replaced by a different material, as was explained above with reference to FIG. 8. Instead, after the front-side etching back of the arrangements in accordance with FIG. 7*a* or 7*b*, an arrangement in accordance with FIG. 9 is directly present, the dielectric layer 50 being formed, for example, from silicon carbide, $Al_2O_3$, sapphire or ruby.

The electrical properties of a TEDFET depend, in particular, on the mobility of the free charge carriers in the accumulation zone, that is to say that region of the drift zone which adjoins the dielectric layer.

The charge carrier mobility of a semiconductor layer can be increased by "straining" the semiconductor layer, that is to say by the lattice constant of the semiconductor layer deviating from its natural lattice constant as a result of an external measure.

A strain of a semiconductor layer can be achieved in particular by fabricating it on crystalline material whose lattice constant deviates from the natural lattice constant of the semiconductor layer, in particular is greater than the natural lattice constant of the semiconductor layer.

Thus, by way of example, a strained, doped or undoped silicon layer can be produced by growing silicon onto a crystal structure made of silicon-germanium which has a larger lattice constant than silicon. Depending on the germanium proportion of the silicon-germanium crystal structure, preferably 4 at % to 25 at %, the electron mobility increases by up to 80%, and the hole mobility by up to 30%, in the silicon layer in this case.

An explanation is given below, with reference to FIGS. 11 to 18, of how it is possible to fabricate a drift zone of a TEDFET that is formed from strained silicon.

In the exemplary embodiment presented here for the fabrication of such a TEDFET, proceeding from the arrangement in accordance with FIG. 2, firstly the patterned mask layer 90 is removed. Afterward, a continuously formed and preferably monocrystalline silicon-germanium layer is applied conformally to the front side of the semiconductor body 10.

Figure 11:
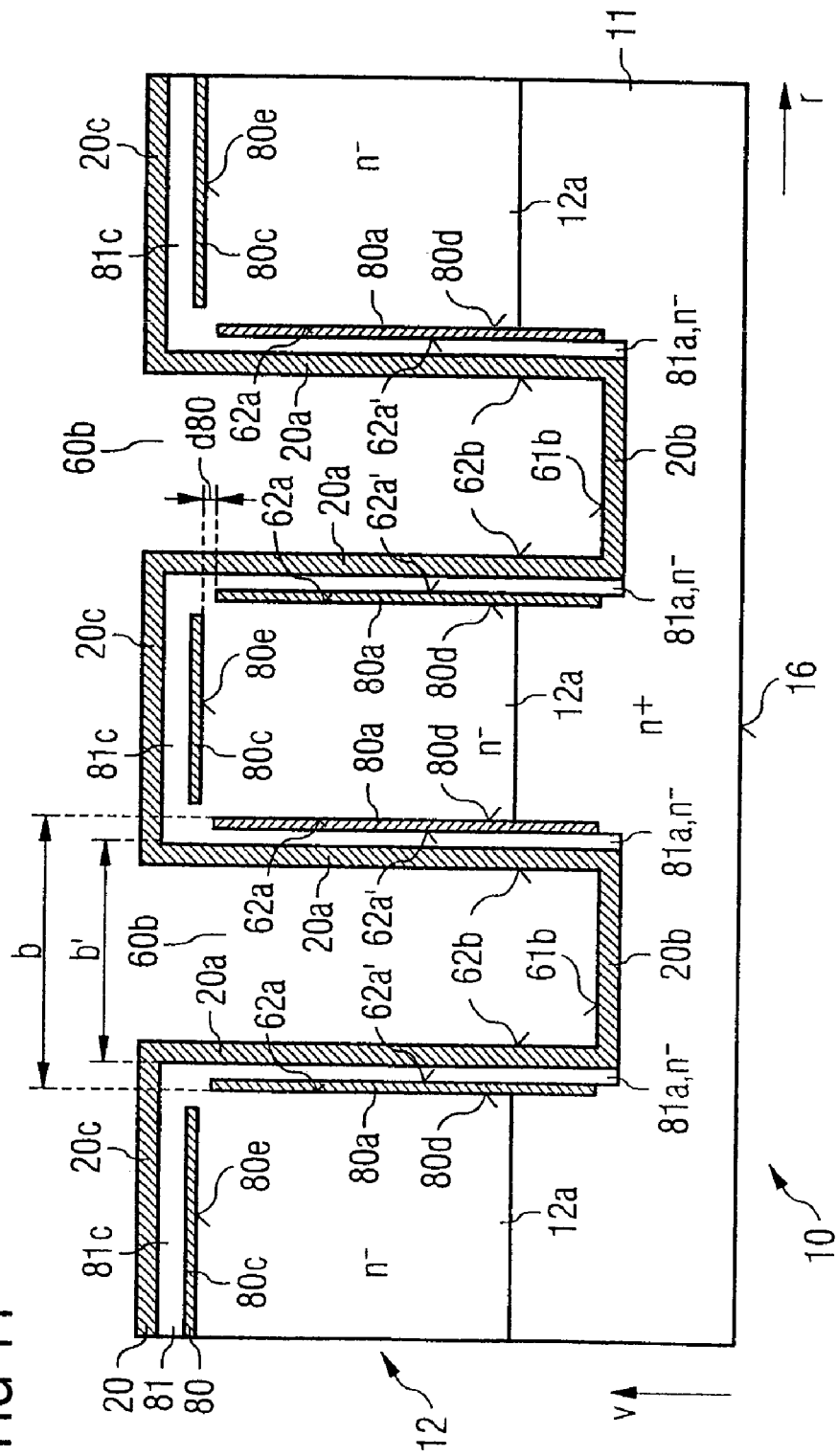
FIG. 11 shows an arrangement according to FIG. 3 in which the coating formed as a dielectric or sacrificial layer has been produced on a strain layer made of silicon-germanium and a strained silicon layer.

FIG. 11 shows the vertical and horizontal sections 80*a* and 80*c*, respectively, which have remained from the monocrystalline silicon-germanium layer 80 after a patterning. The silicon-germanium layer 80 is also referred to hereinafter as a strain layer since a strained silicon layer is produced thereon in a later method step.

After the application of the continuous strain layer 80, a patterned mask layer (not illustrated) is applied thereon, said mask layer having openings above the trenches. Each of said openings is arranged above a trench and extends in the lateral direction r at least over the vertical sections 80a of the strain layer 80, that is to say at least as far as the sides 80d thereof which are remote from the relevant trench.

During a subsequent anisotropic etching-back step using the patterned mask layer, horizontal sections of the silicon-germanium layer 80 that are arranged on the bottoms of the trenches and also underlying semiconductor material of the substrate 11 are removed. In addition, in this case the strain layer 80 is separated in the transition region between the vertical sections 80a and the front-side horizontal sections 80c, thus resulting in the arrangement of the sections 80a and 80c of the strain layer 80 as illustrated in FIG. 11.

What is crucial during the anisotropic etching-back step is in particular that the vertical sections 80a of the strain layer 80 are etched back to below those sides of the horizontal sections 80c of the strain layer 80 which face the rear side 16. This means that those sides 80e of the horizontal sections 80c which face the rear side 16 are spaced apart further by a distance d80 from the rear side than the front-side ends of the vertical sections 80a.

After the subsequent removal of the patterned mask layer, a preferably monocrystalline semiconductor layer 81 made of silicon is applied on the front side, so that the remaining trench 60b has a width b'. Sections of the semiconductor layer 81 form the channel zone of the TEDFET to be fabricated, so that the semiconductor layer is also referred to as channel layer hereinafter.

The horizontal sections of channel layer 81 which are arranged on the bottoms of the trenches may optionally be removed using a patterned mask layer by means of an anisotropic etching method.

A coating 20 is subsequently applied to that arrangement on the front side, which coating corresponds to the coating 20 in accordance with FIG. 3 and, in the same way as the latter, constitutes either a sacrificial layer or else the dielectric from which the dielectric layer to be fabricated is at least partly formed.

The subsequent steps for the further processing of the TEDFET may likewise be carried out in the manner that has been described with reference to FIGS. 3 to 10.

Figure 12:
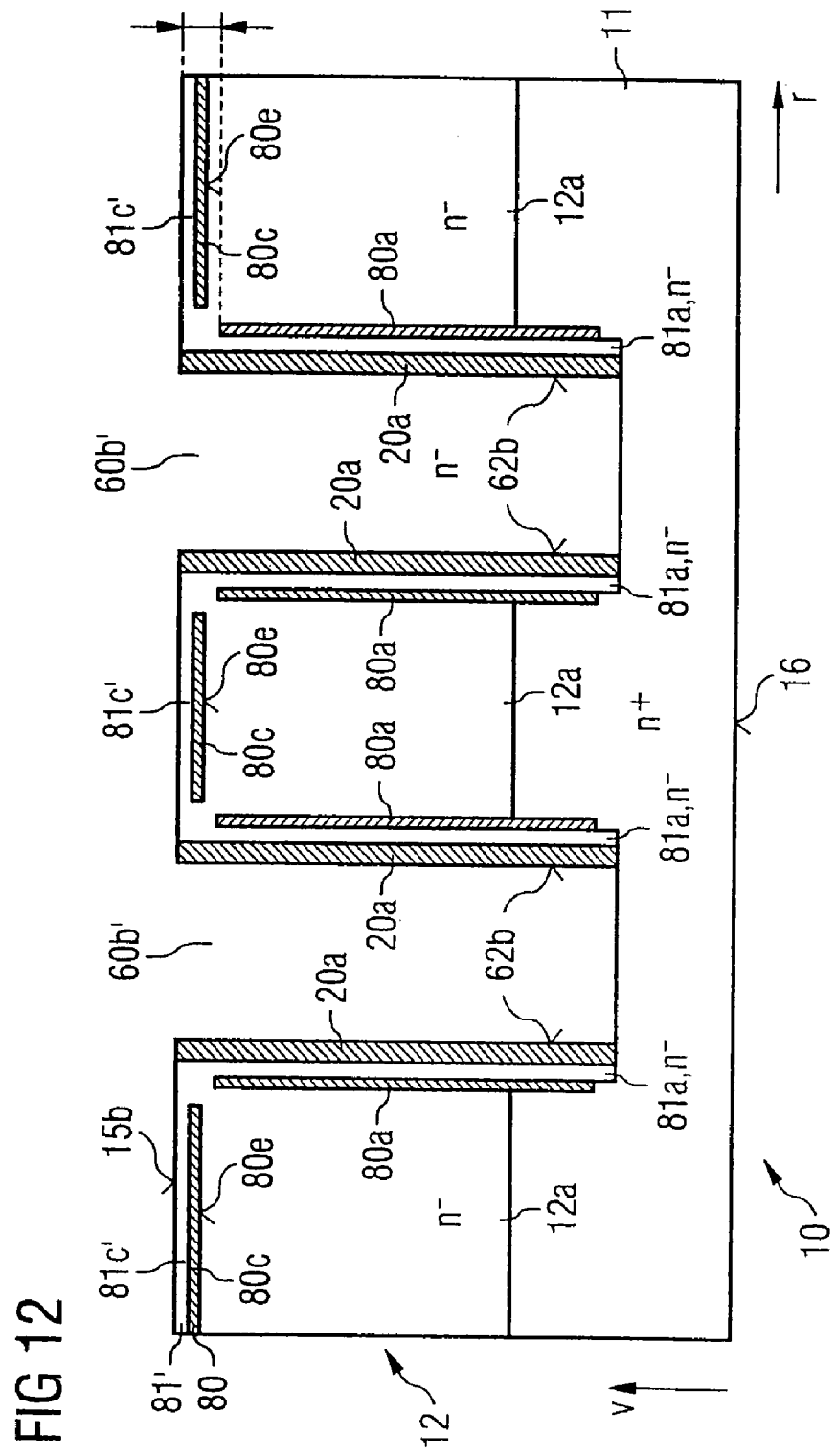
FIG. 12 shows the arrangement in accordance with FIG. 11 after the removal of the horizontal sections of the coating.

As is shown as the result in FIG. 12, firstly the horizontal sections 20b and 20c of the coating 20 are removed by means of an anisotropic, preferably unmasked etching step.

For the case where the coating 20 constitutes a sacrificial layer made of semiconductor material intended to be converted into porous semiconductor material, the coating 20 is converted into porous semiconductor material by means of one of the methods described above—after or preferably prior to the anisotropic etching step for the removal of the horizontal sections 20b and 20c.

Figure 13:
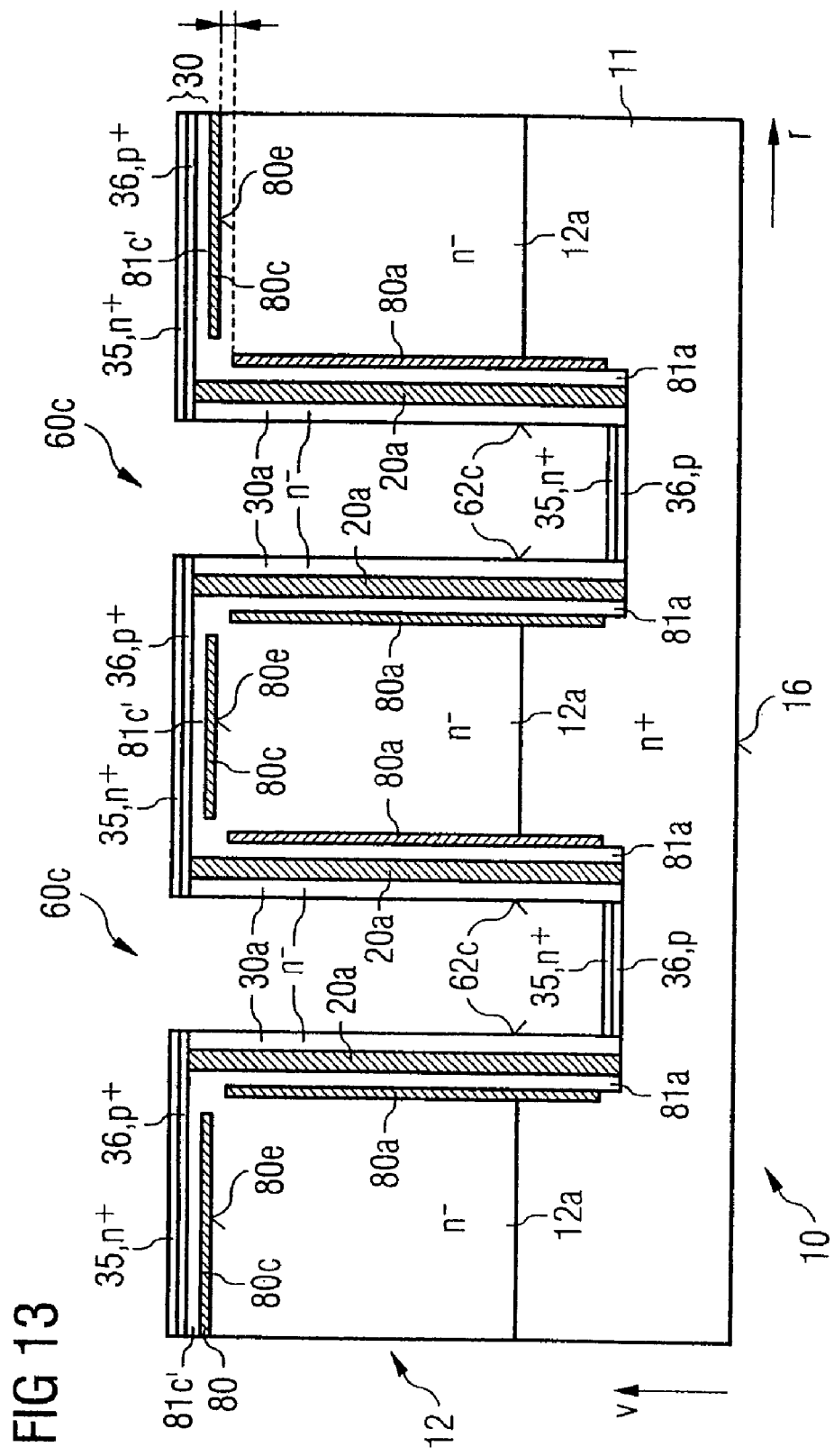
FIG. 13 shows the arrangement in accordance with FIG. 12 after the fabrication of a diode structure in the growth layer in the bottom region of the trenches.

FIG. 13 shows the arrangement in accordance with FIG. 12 after the application of a preferably monocrystalline growth layer 30 in which a diode 35, 36 with a heavily n-doped diode zone 35 and with a p-doped diode zone 36 has been produced by means of implantation.

Afterward, in a manner corresponding to the steps described in the transition from the arrangement in accordance with FIG. 6 to the arrangement in accordance with one of FIG. 7a or 7b, the residual trenches 60c are filled with preferably monocrystalline silicon 40a, 40b in accordance with FIG. 7a or with preferably monocrystalline silicon 40a, 40b and a dielectric 40c, 40d in accordance with FIG. 7b.

A planarization step for the planarization of the front side is subsequently effected, as explained above for the planarization of the arrangement in accordance with FIGS. 7a and 7b.

In a subsequent two-stage etching-back step, the arrangement is etched back, so that the vertical sections 20a of the coating 20 extend as far as the front-side surface.

Figure 14:
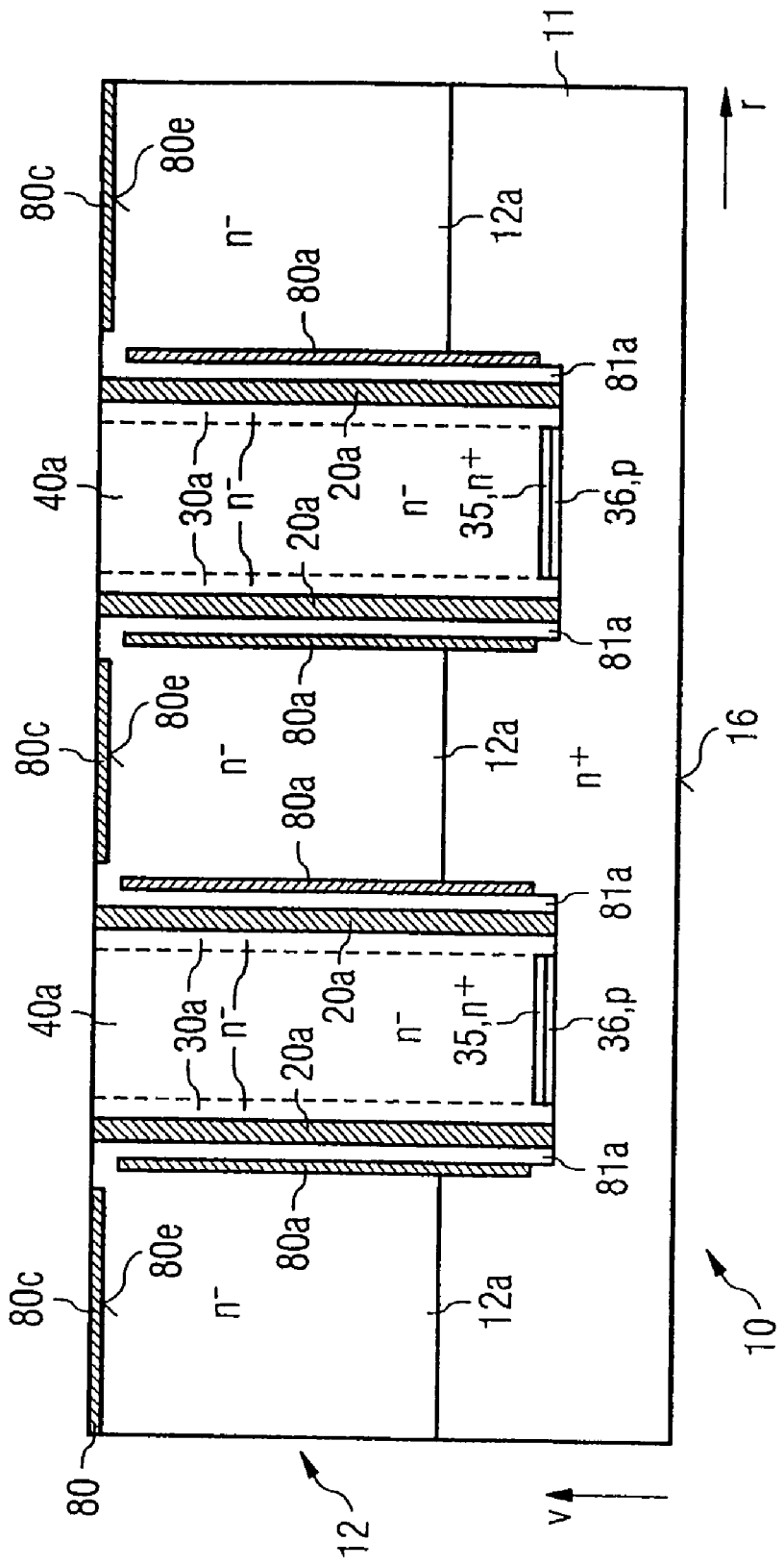
FIG. 14 shows the arrangement in accordance with FIG. 13 after the trenches have been filled and the semiconductor body has been planarized on the front side and etched back as far as horizontal sections of the strain layer.

As shown as the result in FIG. 14, the arrangement is etched back on the front side in a first etching step until it is ascertained by end point detection that the horizontal sections 80c of the strain layer 80 have been reached.

Figure 15:
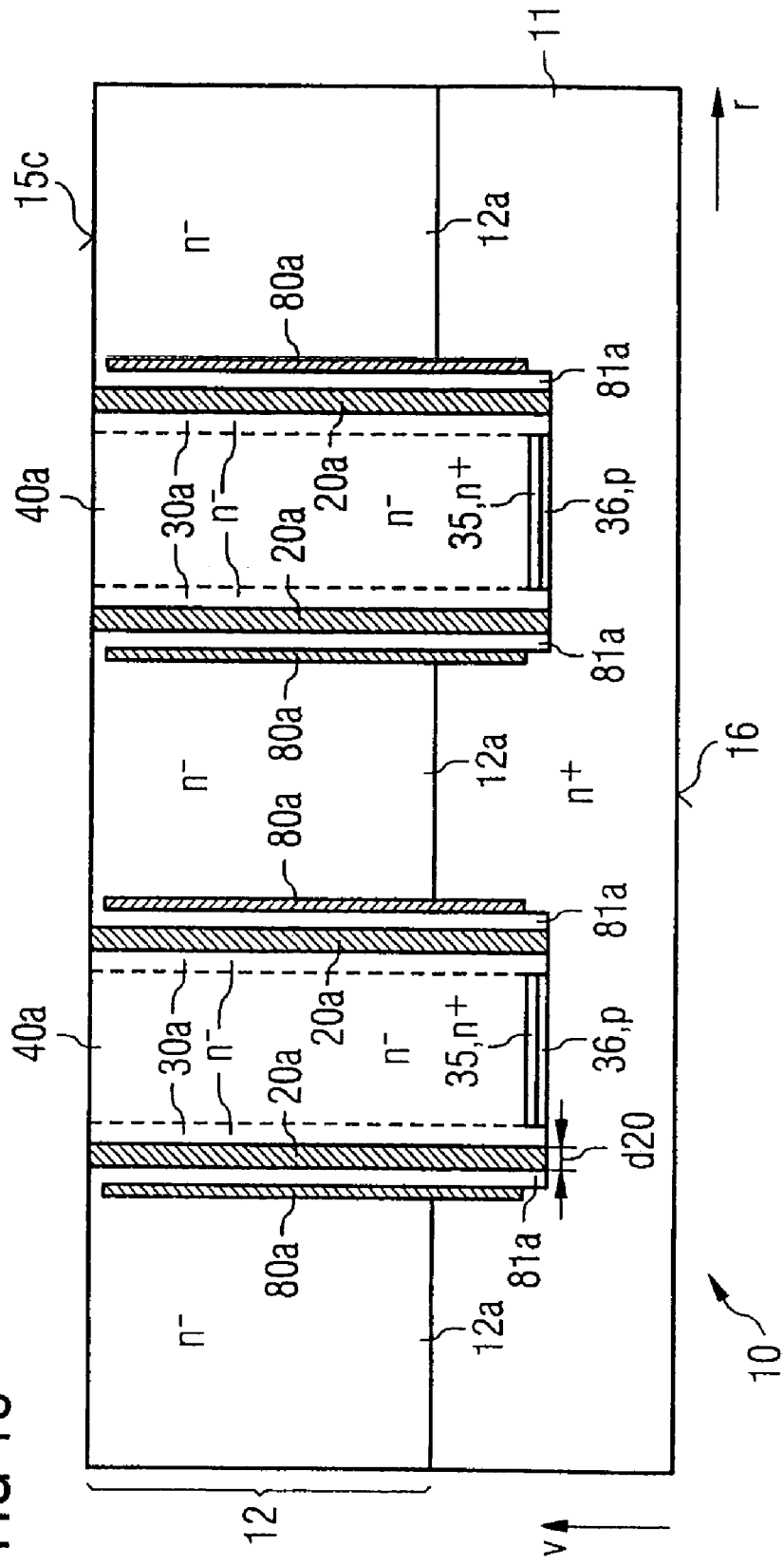
FIG. 15 shows the arrangement in accordance with FIG. 14 after the semiconductor body has been planarized on the front side and etched back by means of a fixed time etch to an extent such that vertical sections of the coating extend as far as the surface of the semiconductor body.

FIG. 15 shows the arrangement in accordance with FIG. 14 after a second etching step, in which the front side is etched back by means of a fixed time etch at least as far as those sides 80e of the horizontal sections 80c which face the rear side 16, the planarity of the front side ideally being preserved.

Figure 16:
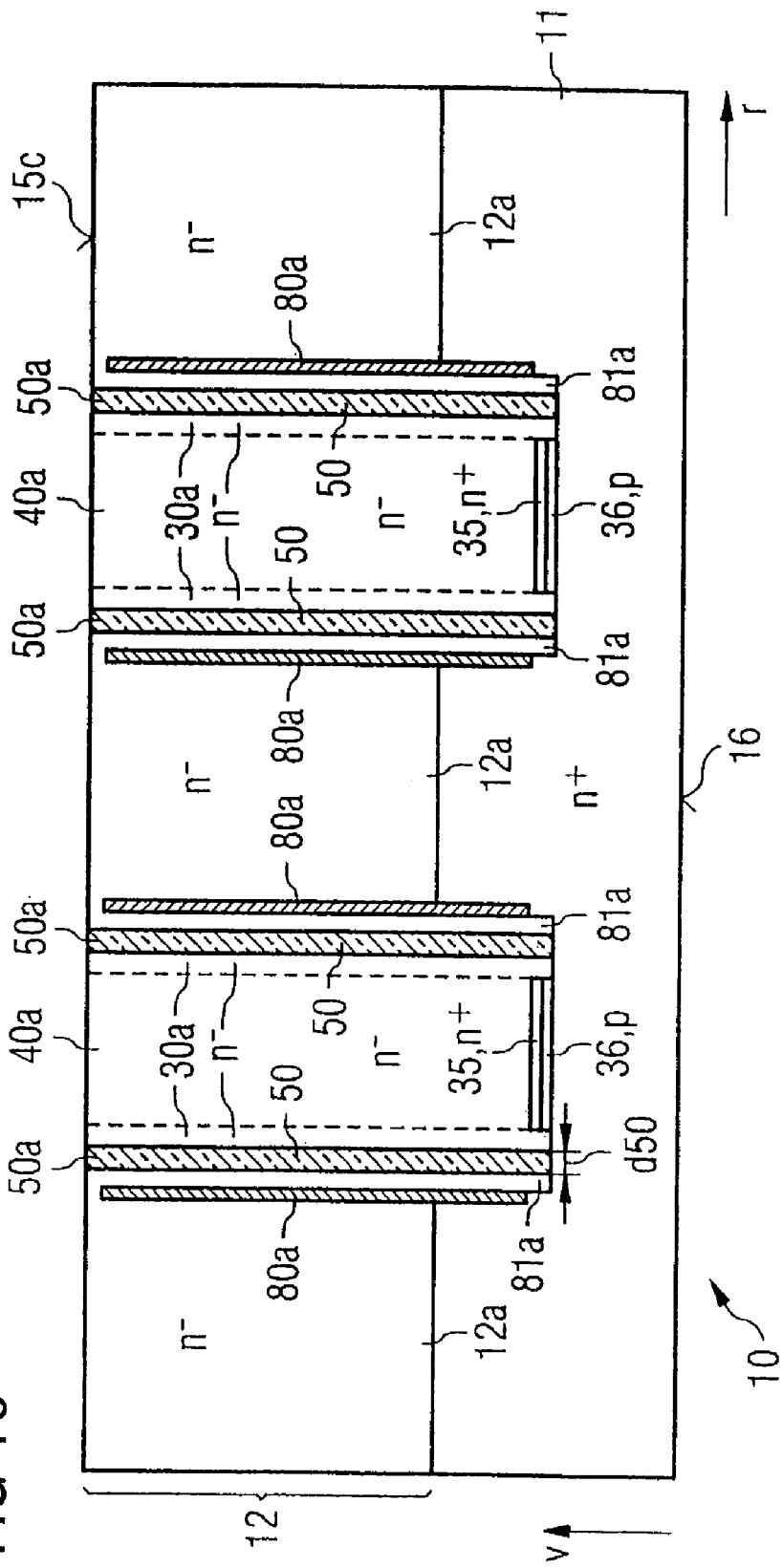
FIG. 16 shows the arrangement in accordance with FIG. 15 after the coating has been replaced by a dielectric.

FIG. 16 shows the arrangement in accordance with FIG. 15 for the case where the coating 20 illustrated here is formed as a sacrificial layer, after the replacement of the sacrificial layer by a dielectric. For this purpose, it is possible to employ the same steps as were described in the transition from the arrangement in accordance with FIG. 8 to the arrangement in accordance with FIG. 9. In this case, the vertical sections 20a in accordance with FIG. 15 were removed by selective etching and replaced by a dielectric 50.

During the selective etching of the vertical sections 20a in accordance with FIG. 15, it must be taken into consideration that the vertical sections 80a of the strain layer 80 preferably do not extend as far as the front side if they are not intended to be attacked by the selective etching.

In the case where the coating 20 does not constitute a sacrificial layer, but rather already contains the material from which the dielectric layer to be fabricated is formed, the selective etching and replacement of the vertical sections 20a in accordance with FIG. 15 may be obviated. The vertical sections 20a in accordance with FIG. 15 are then identical with the sections 50 in accordance with FIG. 16, so that the arrangement in accordance with FIG. 16 may be taken as a basis for the further consideration.

Figure 17:
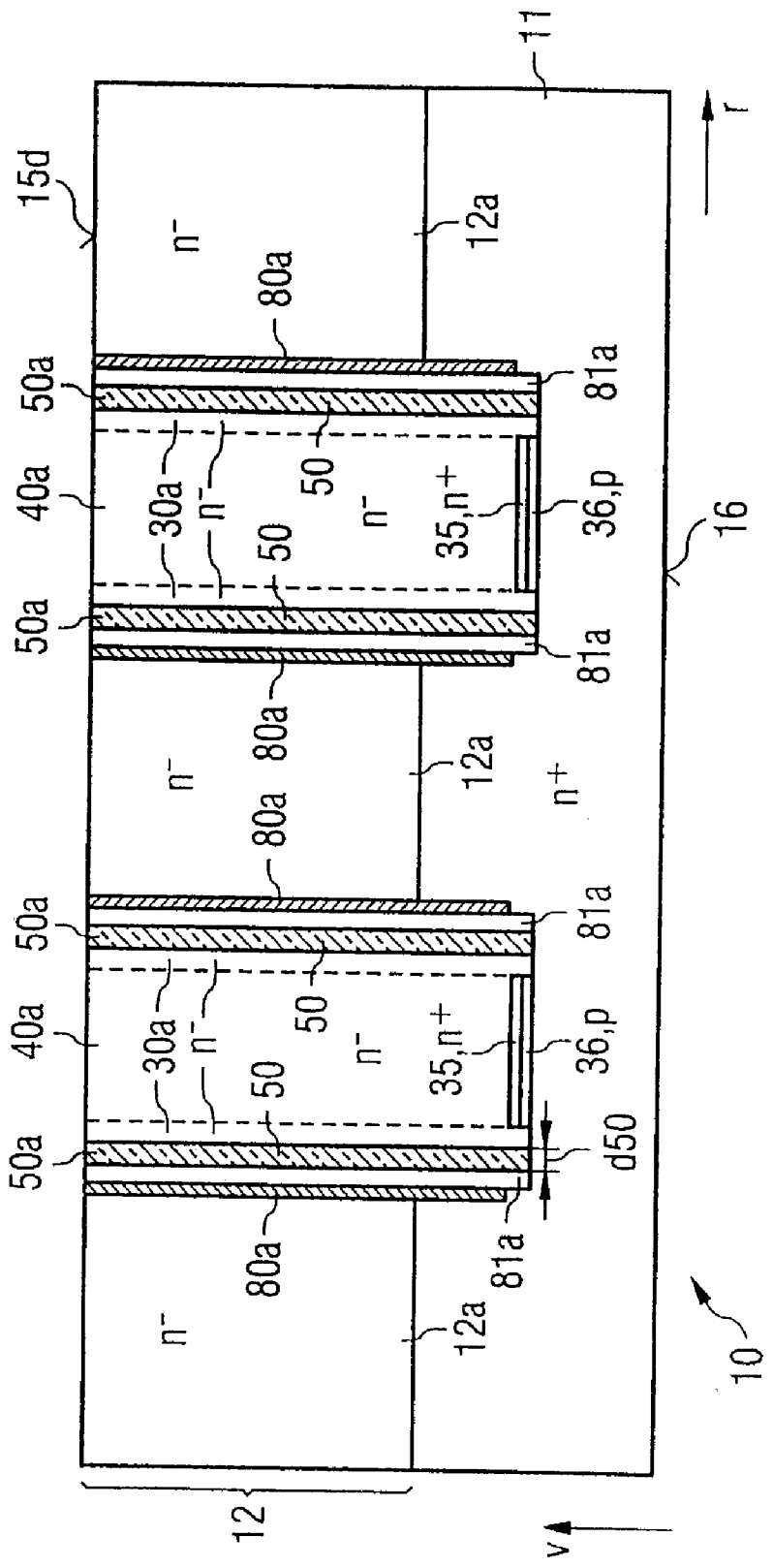
FIG. 17 shows an arrangement according to FIG. 15 or 16 after the semiconductor body has been etched back on the front side, so that the strain layer extends as far as the surface of the semiconductor body.

As is shown as the result in FIG. 17, the arrangement in accordance with FIG. 16 may optionally be etched back on the front side to an extent such that the front-side ends 50a of the dielectric layer 50 extend as far as the front side 15d.

Figure 18:
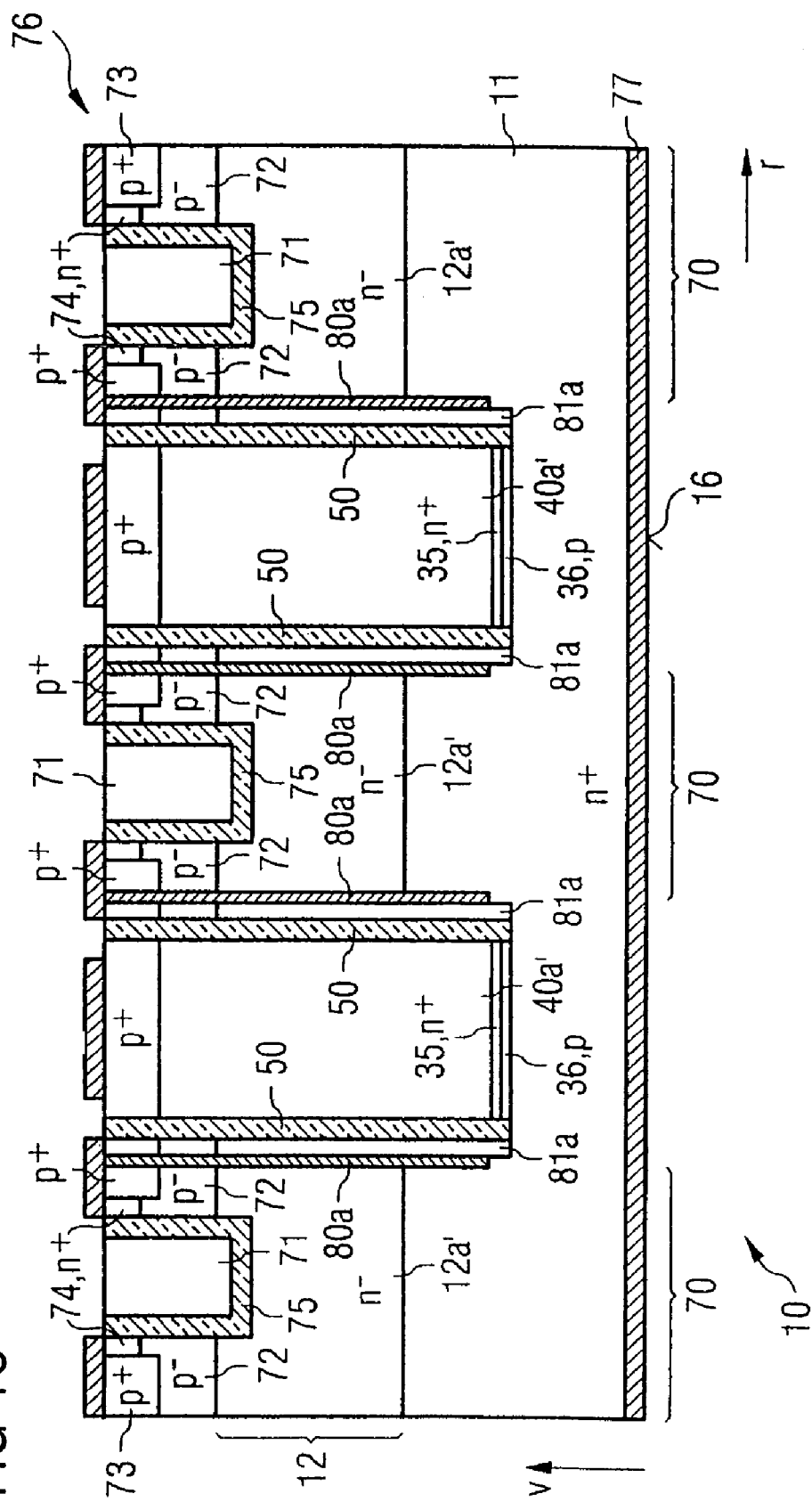
FIG. 18 shows a cross section through a section of a completed TEDFET based on an arrangement in accordance with FIG. 10.

FIG. 18 shows a TEDFET that emerges from the arrangement in accordance with FIG. 17 by virtue of the fact that—as already described with reference to the arrangement in accordance with FIG. 10—traditional MOSFET transistor cells 70 with gate electrodes 71, gate insulations 75, weakly p-doped body zones 72, heavily p-doped bypass zones 73, heavily n-doped source zones 74, a patterned front-side metallization 76 and also a rear-side metallization 77 are fabricated in lateral regions 70 each predetermined by the dimensions of the sections 12a' of the epitaxial layer 12.

While this invention has been described in terms of several preferred embodiments, there are alterations, permutations and equivalents that fall within the scope of this invention. It should also be noted that there are many alternative ways of implementing the methods and compositions of the present invention. It is therefore intended that the following appended claims be interpreted as including such alterations, permutations and equivalents as falling within the true spirit and scope of the present invention.

We claim:

1. A method for fabricating a semiconductor component comprising:
    providing a semiconductor body having a front side and a drift zone region;
    producing a trench extending at least partially into the drift zone region proceeding from the front side;
    producing a sacrificial layer on at least a portion of the sidewalls of the trench;
    filling at least a portion of the trench with a semiconductor material which adjoins the sacrificial layer and which is chosen in such a way that the quotient of the net dopant charge of the semiconductor material arranged in the trench and the total area of the sacrificial layer which is arranged on the at least a portion of the sidewalls of the trench between the semiconductor material and the drift zone region is less than the breakdown charge of the semiconductor material; and
    replacing at least a portion of the sacrificial layer on the at least a portion of the sidewalls of the trench with a dielectric.

2. The method of claim 1, further comprising, prior to replacing the sacrificial layer:
    etching the semiconductor body back from its front side to an extent such that at least one vertical section of the sacrificial layer extends as far as the surface of the etched semiconductor body.

3. The method of claim 1, wherein producing the sacrificial layer comprises:
    producing the sacrificial layer with a material having an increased etching selectivity with respect to the material of the drift zone region adjoining it and with respect to the semiconductor material.

4. The method of claim 1, wherein producing the sacrificial layer comprises:
    producing pores in the sacrificial layer.

5. The method of claim 4, wherein producing the pores is performed prior to filling at least a portion of the trench.

6. The method of claim 4, wherein producing the sacrificial layer comprises:
    fabricating a doped sacrificial layer by fabricating the sacrificial layer as a doped sacrificial layer or by doping the sacrificial layer after its fabrication; and
    producing the pores by selective chemical or anodic electrochemical etching of the doped sacrificial layer.

7. The method of claim 6, wherein producing the sacrificial layer comprises:
    doping the sacrificial layer after its fabrication with carbon and/or germanium.

8. The method of claim 6, wherein producing the sacrificial layer comprises:
    p-doping the sacrificial layer prior to the production of the pores to a dopant concentration of at least $10^{16}$ cm$^3$.

9. The method of claim 6, wherein producing the sacrificial layer comprises:
    n-doping the sacrificial layer prior to the production of the pores to a dopant concentration of at least $10^{16}$ cm$^3$.

10. The method of claim 4, wherein producing the sacrificial layer comprises:
    producing a sacrificial layer comprising the same semiconductor basic material as the semiconductor body.

11. The method of claim 4, further comprising:
    producing an additional layer made of $Si_xGe_yC_z$ in and/or below and/or above the sacrificial layer, wherein x is not zero and wherein y and z are not both simultaneously zero.

12. The method of claim 1, wherein producing the sacrificial layer comprises:
    producing a sacrificial layer including at least one of silicon-germanium (SiGe), aluminum oxide ($Al_2O_3$), sapphire and ruby.

13. The method of claim 1, wherein replacing at least a portion of the sacrificial layer comprises:
    creating a sacrificial layer trench by removing at least a portion of the sacrificial layer from the sidewalls of the trench; and
    thermally oxidizing the sidewalls of the sacrificial layer trench.

14. The method of claim 13, wherein thermally oxidizing the sidewalls comprises:
    thermally oxidizing the sidewalls until the sacrificial layer trench is closed by the thermal oxidation.

15. The method of claim 1, wherein producing the sacrificial layer on at least a portion of the sidewalls of the trench comprises:
    producing a sacrificial layer on at least a portion of the sidewalls of the trench with a thickness of 50% to 60% of a desired thickness of a dielectric layer.

16. The method of claim 1, wherein producing the sacrificial layer on at least a portion of the sidewalls of the trench comprises:
    producing a sacrificial layer on at least a portion of the sidewalls of the trench with a thickness of about 10 nm to 35 nm.

17. The method of claim 1, wherein replacing at least a portion of the sacrificial layer on the at least a portion of the sidewalls of the trench with a dielectric comprises:
    forming a dielectric layer with a thickness of 30 nm to 105 nm.

18. The method of claim 17, wherein replacing the at least a portion of the sacrificial layer on the at least a portion of the sidewalls of the trench with the dielectric comprises:
    forming the dielectric layer with a thickness of 50 nm to 105 nm.

19. A method for fabricating a semiconductor component comprising:
    providing a semiconductor body having a front side and a drift zone region;
    producing a trench extending at least into the drift zone region proceeding from the front side;
    producing a dielectric layer on at least a portion of the sidewalls of the trench; and
    at least partly filling the trench with a semiconductor material which adjoins the dielectric layer and which is chosen in such a way that the quotient of the net dopant charge of the semiconductor material arranged in the trench and the total area of the sections of the dielectric layer which are arranged between the semiconductor material and the drift zone region is less than the breakdown charge of the semiconductor material.

20. The method of claim 19, wherein producing the dielectric layer on at least a portion of the sidewalls of the trench comprises:
    producing a dielectric layer including at least one of silicon carbide and silicon dioxide.

21. The method of claim 19, wherein producing the dielectric layer on at least a portion of the sidewalls of the trench comprises:
    producing the dielectric layer in crystalline or monocrystalline fashion with a lattice constant which, at a temperature of 300 K, differs by at most 0.6% from the lattice constant of a crystal which is free of external influences and which is formed from a semiconductor material of the type of the semiconductor material used for at least partly filling the trench.

22. The method of claim 19, further comprising:
applying a doped, crystalline growth layer made of a semiconductor basic material to the dielectric layer at least in the region of the at least a portion of the sidewall of the trench.

23. The method of claim 22, wherein applying the doped layer comprises;
applying a doped, monocrystalline growth layer to the dielectric layer at least in the region of the at least a portion of the sidewall of the trench.

24. The method of claim 22, wherein applying the doped layer comprises;
applying a doped, crystalline growth layer made of a semiconductor basic material of the same type as the semiconductor basic material of the drift zone region to the dielectric layer at least in the region of the at least a portion of the sidewall of the trench.

25. The method of claim 19, wherein producing the trench comprises:
producing a trench having a width of about 0.05 µm to 1.5 µm per 100 V reverse voltage strength of the semiconductor component to be fabricated.

26. The method of claim 25, wherein producing the trench comprises:
producing a trench with a width of 0.4 µm to 5 µm.

27. A method for fabricating a semiconductor component comprising:
providing a semiconductor body having a front side and a drift zone region;
producing a trench extending at least into the drift zone region proceeding from the front side;
producing a strain layer made of crystalline or monocrystalline semiconductor material on at least a portion of the sidewalls of the trench;
producing a channel layer made of crystalline or monocrystalline semiconductor material and arranged on at least a portion of the strain layer, the lattice constant of the channel layer semiconductor material differing from the lattice constant of the strain layer semiconductor material;
producing a sacrificial layer arranged on at least a portion of the channel layer;
filling the trench at least partly with a semiconductor filling material which adjoins the sacrificial layer and which is chosen in such a way that the quotient of the net dopant charge of the entire semiconductor filling material arranged in the trench and the total area of the sections of the sacrificial layer which are arranged between the semiconductor material and the drift zone region is less than the breakdown charge of the semiconductor material; and
replacing at least a portion of the sacrificial layer with a dielectric.

28. The method of claim 27, wherein producing the channel layer comprises
producing a channel layer with a lattice constant of the channel layer semiconductor material differing by at most 0.6% from the lattice constant of the strain layer semiconductor material.

29. A method for fabricating a semiconductor component comprising:
providing a semiconductor body having a front side and a drift zone region;
producing a trench extending at least into the drift zone region proceeding from the front side;
producing a strain layer made of crystalline or monocrystalline semiconductor material and arranged on at least a portion of the sidewalls of the trench;
producing a channel layer made of crystalline or monocrystalline semiconductor material and arranged on at least a portion of the strain layer, the lattice constant of the channel layer semiconductor material differing from the lattice constant of the strain layer semiconductor material;
producing a dielectric layer arranged on at least a portion of the channel layer; and
filling the trench at least partly with a semiconductor filling material which adjoins the dielectric layer and which is chosen in such a way that the quotient of the net dopant charge of the entire semiconductor filling material arranged in the trench and the total area of the sections of the dielectric layer which are arranged between the semiconductor material and the drift zone region is less than the breakdown charge of the semiconductor material.

30. The method of claim 29, wherein producing the dielectric layer arranged on at least a portion of the channel layer comprises:
producing a section of the dielectric layer which extends 5 µm to 15 µm into the semiconductor body in a vertical direction, perpendicular to the front side, per 100 V reverse voltage strength of the semiconductor component to be fabricated.

31. The method of claim 29, wherein producing the dielectric layer arranged on at least a portion of the channel layer comprises:
producing a section of the dielectric layer that extends at least 30 µm into the semiconductor body in a vertical direction perpendicular to the front side.

32. The method of claim 29, wherein producing the dielectric layer arranged on at least a portion of the channel layer comprises:
producing a section of the dielectric layer that extends at least 50 µm into the semiconductor body in a vertical direction perpendicular to the front side.

* * * * *